United States Patent
Ozawa et al.

(10) Patent No.: US 8,247,857 B2
(45) Date of Patent: Aug. 21, 2012

(54) NONVOLATILE SEMICONDUCTOR MEMORY DEVICE AND METHOD FOR MANUFACTURING SAME

(75) Inventors: Yoshio Ozawa, Kanagawa-ken (JP); Fumiki Aiso, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 606 days.

(21) Appl. No.: 12/405,474

(22) Filed: Mar. 17, 2009

(65) Prior Publication Data

US 2009/0294828 A1 Dec. 3, 2009

(30) Foreign Application Priority Data

Jun. 2, 2008 (JP) ................. 2008-144736

(51) Int. Cl.
*H01L 29/76* (2006.01)
(52) U.S. Cl. ........ 257/314; 257/315; 257/317; 257/321; 257/390; 257/E21.422; 257/E21.21; 257/E21.423; 257/E27.103; 257/E29.129; 257/E29.304; 438/257; 438/265; 438/587; 438/594; 438/595; 365/200
(58) Field of Classification Search .................. 257/314, 257/315, 317, 321, 325, 390, E21.422, E21.536, 257/E21.21, E21.423, E21.679, E27.103, 257/E29.129, E29.226, E29.3, E29.304, E29.309; 438/257, 265, 587, 594, 595; 365/200
See application file for complete search history.

(56) References Cited

U.S. PATENT DOCUMENTS

| 2007/0228447 A1* | 10/2007 | Ozawa ......................... 257/314 |
| 2007/0252201 A1 | 11/2007 | Kito et al. |
| 2008/0150008 A1 | 6/2008 | Kim et al. |
| 2008/0265286 A1* | 10/2008 | Ishimaru et al. .............. 257/214 |

FOREIGN PATENT DOCUMENTS

JP 2007-266143 10/2007

OTHER PUBLICATIONS

U.S. Appl. No. 12/543,685, filed Aug. 19, 2009, Sekine, et al.
U.S. Appl. No. 12/563,651, filed Sep. 21, 2009, Kamioka, et al.
U.S. Appl. No. 13/008,469, filed Jan. 18, 2011, Sekine et al.
U.S. Appl. No. 13/234,406, filed Sep. 16, 2011, Sekine, et al.

* cited by examiner

*Primary Examiner* — Meiya Li
(74) *Attorney, Agent, or Firm* — Oblon, Spivak, McClelland, Maier & Neustadt, L.L.P.

(57) ABSTRACT

A nonvolatile semiconductor memory device includes: a semiconductor member; a memory film provided on a surface of the semiconductor member and being capable of storing charge; and a plurality of control gate electrodes provided on the memory film, spaced from each other, and arranged along a direction parallel to the surface. Average dielectric constant of a material interposed between one of the control gate electrodes and a portion of the semiconductor member located immediately below the control gate electrode adjacent to the one control gate electrode is lower than average dielectric constant of a material interposed between the one control gate electrode and a portion of the semiconductor member located immediately below the one control gate electrode.

5 Claims, 29 Drawing Sheets

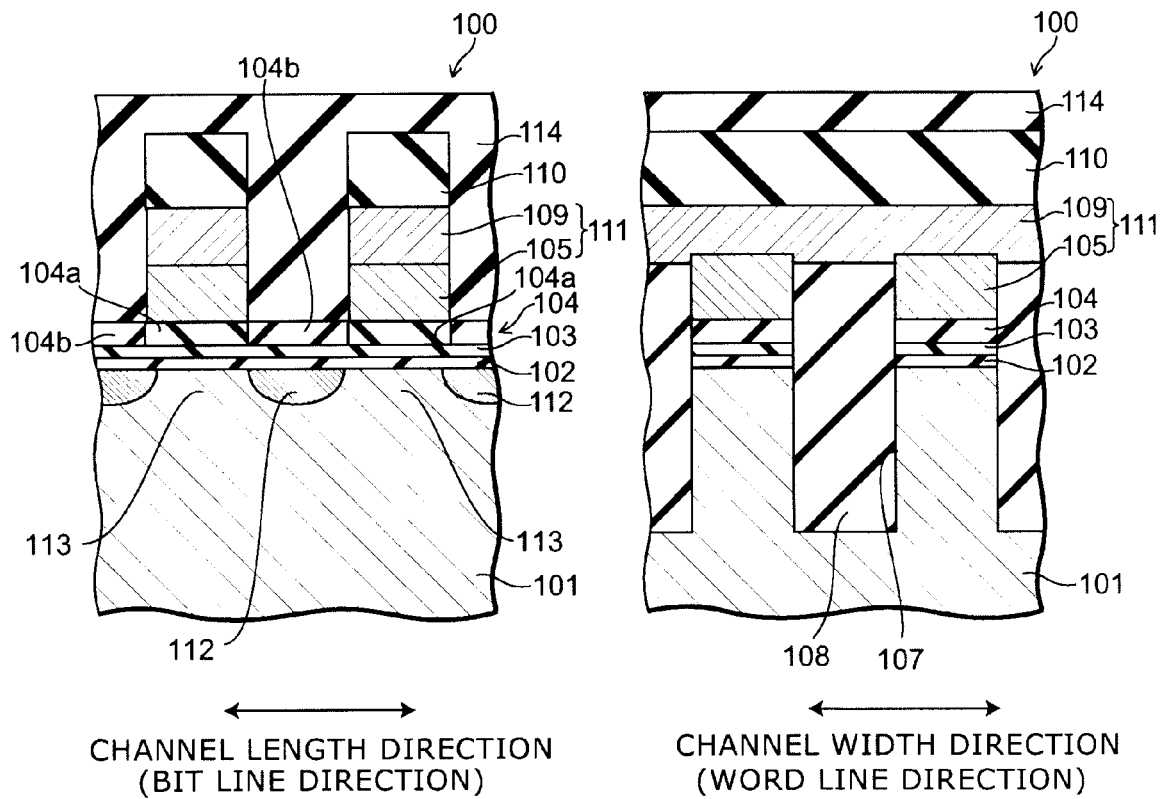
CHANNEL LENGTH DIRECTION
(BIT LINE DIRECTION)
FIG. 5A
CHANNEL WIDTH DIRECTION
(WORD LINE DIRECTION)
FIG. 5B
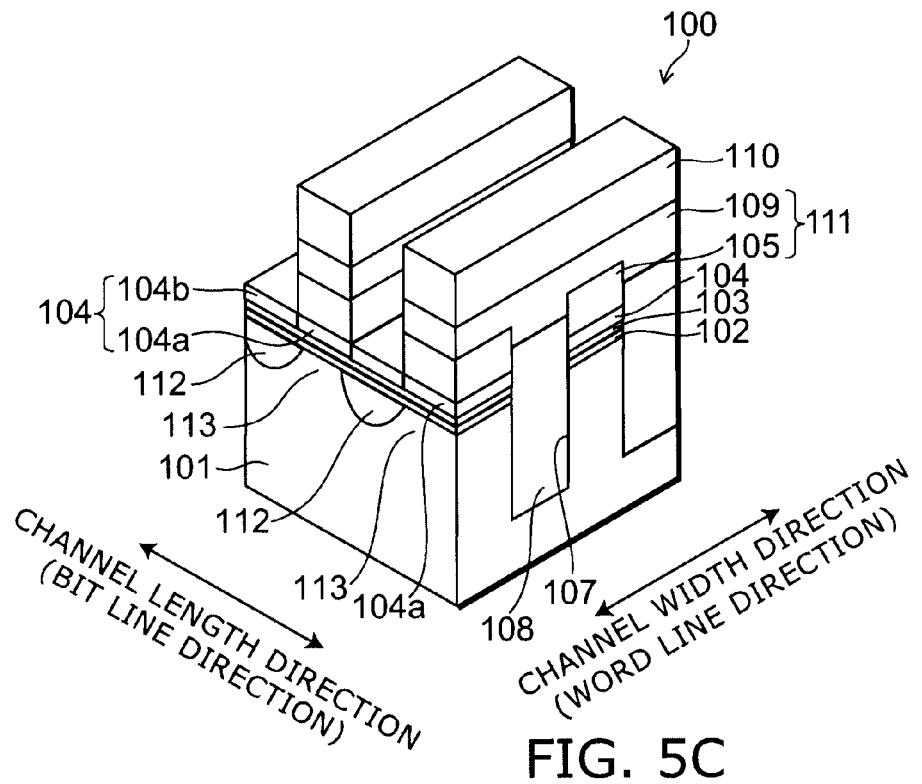
FIG. 5C

CHANNEL LENGTH DIRECTION
(BIT LINE DIRECTION)

CHANNEL WIDTH DIRECTION
(WORD LINE DIRECTION)

CHANNEL LENGTH DIRECTION
(BIT LINE DIRECTION)

CHANNEL WIDTH DIRECTION
(WORD LINE DIRECTION)

CHANNEL LENGTH DIRECTION
(BIT LINE DIRECTION)

CHANNEL WIDTH DIRECTION
(WORD LINE DIRECTION)

CHANNEL LENGTH DIRECTION
(BIT LINE DIRECTION)

CHANNEL WIDTH DIRECTION
(WORD LINE DIRECTION)

CHANNEL LENGTH DIRECTION
(BIT LINE DIRECTION)

CHANNEL WIDTH DIRECTION
(WORD LINE DIRECTION)

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2008-144736, filed on Jun. 2, 2008; the entire contents of which are incorporated herein by reference.

BACKGROUND OF THE INVENTION

1. Field of the Invention

This invention relates to a nonvolatile semiconductor memory device and a method for manufacturing the same.

2. Background Art

Conventionally, nonvolatile semiconductor memory devices such as NAND flash memories have been fabricated by two-dimensionally integrating elements on the surface of a silicon substrate. In this type of flash memory, increasing the degree of integration by downscaling is required to reduce cost per bit and increase memory capacity. However, downscaling tends to cause the problem of interference between adjacent memory cells, which leads to malfunction of memory cells. For example, data once stored in a memory cell may be erased by operation of its adjacent memory cell.

As a technique for increasing the degree of integration of a memory, for example, JP-A-2007-266143(Kokai) proposes a technique of three-dimensionally stacking memory cells. In the technique disclosed in this publication, electrode films and dielectric films are alternately stacked on a silicon substrate to form a stacked body, and a plurality of through holes are formed in this stacked body by a single processing. A charge storage layer is formed on the side surface of the through hole, and then silicon is buried inside the through hole to form a silicon pillar. Thus, a memory cell is formed at the intersection between each electrode film and each silicon pillar, resulting in a three-dimensional arrangement of memory cells.

However, even in this type of three-dimensionally stacked memory, the electrode film and the dielectric film need to be thinned to increase the number of stacked films for higher degree of integration while restricting the aspect ratio of the through hole. Furthermore, thinning the electrode film and the dielectric film decreases the distance between memory cells arranged along the silicon pillar, and again tends to cause interference between adjacent memory cells.

SUMMARY OF THE INVENTION

According to an aspect of the invention, there is provided a nonvolatile semiconductor memory device including: a semiconductor member; a memory film provided on a surface of the semiconductor member and being capable of storing charge; and a plurality of control gate electrodes provided on the memory film, spaced from each other, and arranged along a direction parallel to the surface, average dielectric constant of a material interposed between one of the control gate electrodes and a portion of the semiconductor member located immediately below the control gate electrode adjacent to the one control gate electrode being lower than average dielectric constant of a material interposed between the one control gate electrode and a portion of the semiconductor member located immediately below the one control gate electrode.

According to another aspect of the invention, there is provided a nonvolatile semiconductor memory device including: a semiconductor member; a memory film provided on a surface of the semiconductor member and being capable of storing charge; and a plurality of control gate electrodes and intercellular dielectric films provided on the memory film and alternately arranged along a direction parallel to the surface, at least a portion of the intercellular dielectric film protrudes toward the semiconductor member.

According to still another aspect of the invention, there is provided a method for manufacturing a nonvolatile semiconductor memory device, including: alternately forming control gate electrodes and intercellular dielectric films on a substrate to form a stacked body; forming a through hole in the stacked body, the through hole extending in the stacking direction of the control gate electrode and the intercellular dielectric film; removing a portion of the control gate electrode exposed to a side surface of the through hole; forming a memory film capable of storing charge on the side surface of the through hole; and forming a semiconductor member inside the through hole.

According to still another aspect of the invention, there is provided a method for manufacturing a nonvolatile semiconductor memory device, including: alternately forming control gate electrodes and intercellular dielectric films on a substrate to form a stacked body; forming a through hole in the stacked body, the through hole extending in the stacking direction of the control gate electrode and the intercellular dielectric film; removing a portion of the intercellular dielectric film on a side surface of the through hole; forming a memory film capable of storing charge on the side surface of the through hole; and forming a semiconductor member inside the through hole, the forming an intercellular dielectric film including: depositing doped silicon oxide to form a lower portion; depositing non-doped silicon oxide to form an intermediate portion; and depositing doped silicon oxide to form an upper portion, and the removing a portion of the intercellular dielectric film being removing a portion of the upper portion and the lower portion exposed to the side surface of the through hole.

BRIEF DESCRIPTION OF THE DRAWINGS

FIGS. 5A to 5C show a NAND memory according to a first example of the first embodiment;

DETAILED DESCRIPTION OF THE INVENTION

Embodiments of the invention will now be described with reference to the drawings.

To begin with, a first embodiment of the invention is described.

The nonvolatile semiconductor memory device according to this embodiment is a NAND memory.

Figure 1:
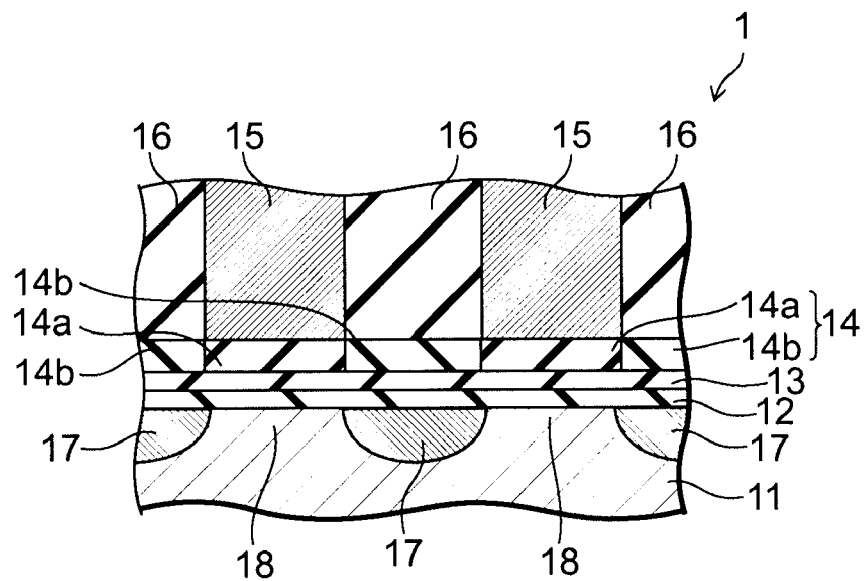
FIG. 1 is a cross-sectional view illustrating a NAND memory according to a first embodiment of the invention, showing a cross section parallel to the channel length direction.

FIG. 1 is a cross-sectional view illustrating the NAND memory according to this embodiment, showing a cross section parallel to the channel length direction (bit line direction).

As shown in FIG. 1, the NAND memory 1 according to this embodiment includes, as a semiconductor member, a semiconductor substrate 11 illustratively made of single crystal silicon (Si) having p-type conductivity. On the surface of this semiconductor substrate 11 is provided an insulative tunnel dielectric layer 12 illustratively made of silicon oxide, and an insulative charge storage layer 13 illustratively made of silicon nitride is provided thereon. Furthermore, an insulative charge block layer 14 illustratively made of alumina is provided on the charge storage layer 13. The tunnel dielectric layer 12, the charge storage layer 13, and the charge block layer 14 constitute a memory film capable of storing charge.

On the charge block layer 14, control gate electrodes 15 made of conductor illustratively polycrystalline silicon doped with impurities and intercellular dielectric films 16 illustratively made of silicon oxide are alternately and periodically provided along one direction parallel to the surface of the semiconductor substrate 11. That is, the intercellular dielectric film 16 is provided in a spacing region for spacing the control gate electrodes 15 from each other, and thereby the control gate electrodes 15 are spaced and insulated from each other by the intercellular dielectric film 16. The width of each of the control gate electrode 15 and the intercellular dielectric film 16 in this arranging direction is illustratively below 100 nm (nanometers), and more specifically 50 nm.

A region in the upper portion of the semiconductor substrate 11 immediately below the intercellular dielectric film 16 is doped with dopant impurities, such as phosphorus (P), to form an n-type diffusion region 17. A region in the upper portion of the semiconductor substrate 11 immediately below the control gate electrode 15, that is, a region between the diffusion regions 17, serves as a channel region 18. That is, in the NAND memory 1, the arranging direction of the control gate electrodes 15 and the intercellular dielectric films 16 is a channel length direction, and also a bit line direction.

The charge block layer 14 is a continuous film extending in the channel length direction. In the charge block layer 14, the portion 14a immediately below the control gate electrode 15 is different in composition or structure from the portion 14b immediately below the intercellular dielectric film 16, and the portion 14b has a lower dielectric constant than the portion 14a. It is noted that the portion 14b of the charge block layer 14 is located immediately below the spacing region for spacing the control gate electrodes 15 from each other.

Several methods exist for making the dielectric constant of the portion 14b lower than the dielectric constant of the portion 14a, and are broadly classified into the methods of decreasing the dielectric constant of the portion 14b after forming the charge block layer 14, and the methods of increasing the dielectric constant of the portion 14a after forming the charge block layer 14. In the following, specific methods are illustrated. With regard to the methods described below, it is possible to perform only one of the methods, or more than one of the methods in combination.

The methods of decreasing the dielectric constant of the portion 14b illustratively include the following methods (1)-(5).

(1) Selectively adding hydrogen (H) or a halogen element such as chlorine (Cl) to the portion 14b.

(2) Selectively adding a noble gas element such as helium (He) or argon (Ar) to the portion 14b to form micro voids in the portion 14b.

(3) Selectively adding carbon (C) to the portion 14b.

(4) Selectively adding to the portion 14b a metallic element that can compose a similar compound having a lower dielectric constant than the base compound constituting the charge block layer 14. The "similar compound" used herein refers to the compound having elements except the principal metallic element in common. For example, in the case where the base compound of the charge block layer 14 is alumina as described above, a low-dielectric metal that can compose a similar compound, i.e., oxide, having a lower dielectric constant than alumina is added. For example, because silicon oxide has a lower dielectric constant than alumina, silicon is added.

(5) Selectively adding oxygen (O) to the portion 14b in the case where the charge block layer 14 is formed from nitride.

The methods of increasing the dielectric constant of the portion 14a illustratively include the following methods (6) and (7).

(6) Selectively adding to the portion 14a a metallic element that can compose a similar compound having a higher dielectric constant than the base compound constituting the charge block layer 14. For example, in the case where the base compound of the charge block layer 14 is alumina as described above, a high-dielectric metal that can compose, for example, hafnium oxide or lanthanum oxide having a higher dielectric constant than alumina, i.e., hafnium (Hf) or lanthanum (La), is added.

(7) Selectively adding nitrogen (N) to the portion 14a in the case where the charge block layer 14 is formed from oxide such as alumina.

The above method (1) makes the concentration of hydrogen or the halogen element in the portion 14b higher than the concentration of hydrogen or the halogen element in the portion 14a. The above method (2) makes the concentration of the noble gas element in the portion 14b higher than the concentration of the noble gas element in the portion 14a. The above method (3) makes the carbon concentration in the portion 14b higher than the carbon concentration in the portion 14a. The above method (4) makes the concentration of the low-dielectric metal, such as silicon, in the portion 14b higher than the concentration of the low-dielectric metal in the portion 14a. The above method (5) makes the oxygen concentration in the portion 14b higher than the oxygen concentration in the portion 14a. On the other hand, the above method (6) makes the concentration of the high-dielectric metal in the portion 14a higher than the concentration of the high-dielectric metal in the portion 14b. The above method (7) makes the nitrogen concentration in the portion 14a higher than the nitrogen concentration in the portion 14b.

Thus, in the NAND memory 1, the material (primarily the tunnel dielectric layer 12, the charge storage layer 13, and the charge block layer 14b) interposed between one control gate electrode 15 and the portion (channel region 18) of the semiconductor substrate 11 immediately below a control gate electrode 15 adjacent to the one control gate electrode 15 has a lower average dielectric constant than the material (the tunnel dielectric layer 12, the charge storage layer 13, and the charge block layer 14a) interposed between one control gate electrode 15 and the portion (channel region 18) of the semiconductor substrate 11 immediately below the one control gate electrode 15.

Next, the operation of the NAND memory according to this embodiment is described.

In the NAND memory 1, a field effect-type cell transistor is formed for each control gate electrode 15, where the tunnel dielectric layer 12, the charge storage layer 13, and the charge block layer 14b serve as a gate dielectric film, and the diffusion region 17 serves as a source/drain region. Furthermore, in the NAND memory 1, a memory string is formed from a plurality of memory cells connected in series.

By applying a positive electric potential to any one of the control gate electrodes 15, electrons are injected from the semiconductor substrate 11 through the tunnel dielectric layer 12 into the charge storage layer 13 (this is referred to as "write operation"). On the other hand, by applying a negative electric potential to the control gate electrode 15, holes are injected from the semiconductor substrate 11 through the tunnel dielectric layer 12 into the charge storage layer 13, or electrons stored in the charge storage layer 13 are released to the semiconductor substrate 11 through the tunnel dielectric layer 12 (this is referred to as "erase operation"). Thus, a binary data can be written into each cell transistor. Furthermore, by discretely controlling the total amount of electrons or holes stored in the charge storage layer 13, a multilevel data can be written into each cell transistor. Moreover, the amount of electrons or holes stored in the charge storage layer 13 can be sensed by detecting the threshold of the cell transistor. This enables the written data to be read. Thus, in the NAND memory 1, a MONOS type (metal-oxide-nitride-oxide-silicon type) memory cell is formed for each control gate electrode 15.

In the NAND memory 1, the portion 14a of the charge block layer 14 having a relatively high dielectric constant is interposed between the control gate electrode 15 and the channel region 18 of the same memory cell (hereinafter also simply referred to as "between the gate and the channel"), and hence increases the capacitance between the gate and the channel. Thus, when the potential of the control gate electrode 15 of the memory cell to be written (hereinafter referred to as "selected memory cell") is controlled, a strong electrical effect can be exerted on the channel region 18 of this memory cell (hereinafter referred to as "selected channel").

In contrast, the portion 14b of the charge block layer 14 having a relatively low dielectric constant is interposed between the control gate electrode 15 of the selected memory cell and the channel region 18 of a memory cell adjacent to this selected memory cell (this channel is hereinafter referred to as "adjacent channel"), and hence decreases the capacitance between the gate and the adjacent channel. Thus, when the potential of the control gate electrode of the selected memory cell is controlled, the electrical effect exerted on the adjacent channel can be reduced.

Next, the effect of this embodiment is described.

As described above, this embodiment can reduce the electrical effect exerted on the adjacent channel while allowing the control gate electrode of the selected memory cell to effectively exert electrical control over the selected channel. This serves to reduce the effect where the control gate electrode 15 of a memory cell affects the potential of the channel region 18 of the adjacent memory cell to vary the threshold of the cell transistor constituting this adjacent memory cell (this effect is hereinafter referred to as "neighboring gate effect"). Consequently, even if the distance between memory cell decreases with the downscaling of the NAND memory cell 1, this embodiment can prevent interference between memory cells, and avoid malfunction of memory cells due to threshold variation of the cell transistor.

It is noted that the boundary between the portion 14a and the portion 14b in the charge block layer 14 does not necessarily need to be located immediately below the boundary between the control gate electrode 15 and the intercellular dielectric film 16, but may be displaced toward either the control gate electrode 15 or the intercellular dielectric film 16.

To improve the reliability of the memory cell, the boundary between the portion 14a and the portion 14b is preferably located on the control gate electrode 15 side, for the following reason. The charge block layer located immediately below the end portion of the control gate electrode has a degraded film quality due to processing damage during the manufacturing process, and is likely to trap charge. However, decreasing the dielectric constant of the charge block layer in this region serves to decrease the amount of charge passing through the charge block layer in this region during write/erase operation, thereby reducing the amount of charge traps. The above effect can be achieved by setting the amount of displacement of the boundary to generally 1/10 or more of the width of the control gate electrode 15.

On the other hand, to accelerate the write/erase operation speed of the memory cell, the boundary between the portion 14a and the portion 14b is preferably located on the intercellular dielectric film 16 side, for the following reason. The electric field between the gate and the channel in the vicinity of the end portion of the control gate electrode is relaxed, and this region does not make an effective contribution to the write/erase operation speed. However, increasing the dielectric constant of the charge block layer in this region serves to increase the amount of charge passing through the tunnel dielectric layer in this region during write/erase operation. The above effect can be achieved by setting the amount of displacement of the boundary to generally 1/10 or more of the width of the control gate electrode 15.

The concentration of the element such as chlorine introduced into the portion 14b of the charge block layer 14 is preferably 1 to 30 atomic % in average concentration. This can decrease the dielectric constant of the portion 14b by approximately 1 to 50%. The average concentration being set to 1 atomic % or more serves to significantly reduce the neighboring gate effect, thereby decreasing the frequency of malfunctions of the memory cell. On the other hand, the average concentration being set to 30 atomic % or less serves to avoid the degradation of insulation in the portion 14b of the charge block layer 14, thereby reliably preventing malfunction due to dielectric breakdown failure or charge leakage.

Next, a comparative example of the first embodiment is described.

Figure 2:
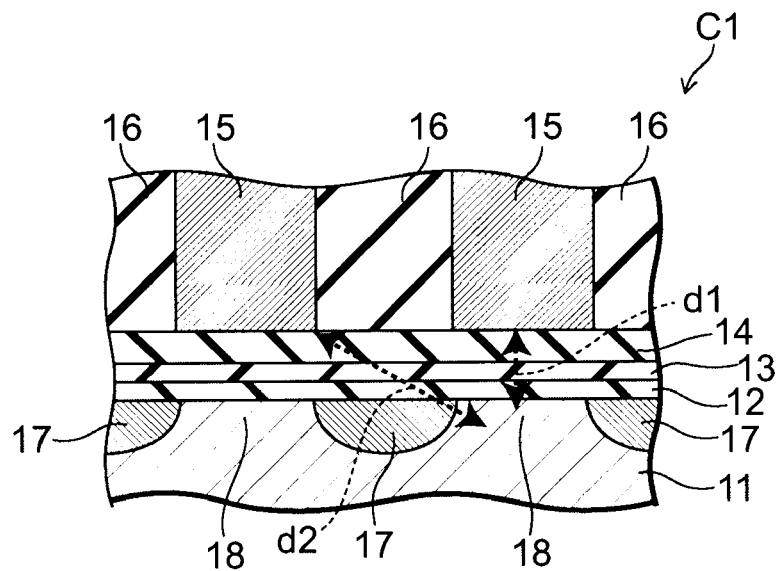
FIG. 2 is a cross-sectional view illustrating a NAND memory according to a comparative example of the first embodiment, showing a cross section parallel to the channel length direction.

FIG. 2 is a cross-sectional view illustrating a NAND memory according to this comparative example, showing a cross section parallel to the channel length direction.

As shown in FIG. 2, in the NAND memory C1 according to this comparative example, the charge block layer 14 is not divided into portions 14a and 14b (see FIG. 1), but is entirely uniform in composition and structure. Hence, the dielectric constant is uniform throughout the charge block layer 14. For example, the charge block layer 14 is entirely formed from alumina with no hydrogen or a halogen element introduced therein.

The NAND memory C1 has no particular problem if the distance d2 between the control gate electrode 15 of a memory cell and the channel region 18 of a memory cell adjacent thereto is sufficiently larger than the distance d1 between the control gate electrode 15 and the channel region 18 of the same memory cell.

However, if the ratio d2/d1 decreases with the downscaling of the NAND memory C1, the aforementioned neighboring gate effect occurs. More specifically, the potential of the control gate electrode 15 of a memory cell to be written (selected memory cell) affects the potential of the channel region of a memory cell adjacent to this memory cell (adjacent channel) to vary the threshold of the cell transistor. This causes malfunction of the cell transistor. For example, the neighboring gate effect is not negligible if the ratio d2/d1 is less than 5, and memory malfunction manifests itself if the ratio d2/d1 is less than 2. Because the distance d1 is illustratively 20 to 30 nm, the neighboring gate effect is not negligible if the spacing between adjacent memory cells is approximately 100 nm or less. It is noted that the distance d1 can indeed be increased as the dielectric constant of the tunnel dielectric layer 12, the charge storage layer 13, and the charge block layer 14 is increased. However, this increases the ratio d2/d1, making the neighboring gate effect more serious.

In contrast, in the above first embodiment, the portion 14b of the charge block layer 14 has a lower dielectric constant than the portion 14a. Hence, the electrically effective value of the ratio d2/d1 can be made larger than its physical value. More specifically, the electrically effective value (d2/∈2)/(d1/∈1) can be increased, where ∈2 is the average dielectric constant between the control gate electrode of the selected memory cell and the adjacent channel, and ∈1 is the average dielectric constant between the control gate electrode of the selected memory cell and the selected channel. Thus, interference between memory cells can be prevented despite the downscaling of the NAND memory.

Next, a first variation of the first embodiment is described.

Figure 3:
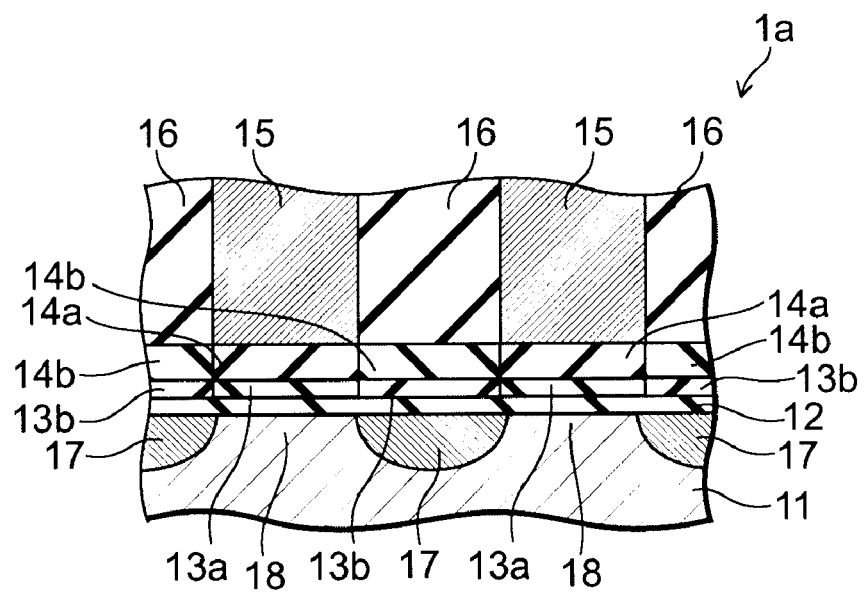
FIG. 3 is a cross-sectional view illustrating a NAND memory according to a first variation of the first embodiment, showing a cross section parallel to the channel length direction.

FIG. 3 is a cross-sectional view illustrating a NAND memory according to this variation, showing a cross section parallel to the channel length direction.

As shown in FIG. 3, in the NAND memory 1a according to this variation, not only in the charge block layer 14 but also in the charge storage layer 13 is the dielectric constant different between the portion 13a immediately below the control gate electrode 15 and the portion 13b immediately below the intercellular dielectric film 16. That is, the portion 13b has a lower dielectric constant than the portion 13a. The method for making the dielectric constant of the portion 13b of the charge storage layer 13 lower than the dielectric constant of the portion 13a can be based on those similar to the methods for making the dielectric constant of the portion 14b of the charge block layer 14 lower than the dielectric constant of the portion 14a in the above first embodiment. For example, hydrogen or a halogen element can be selectively added to the portion 13b of the charge storage layer 13.

According to this variation, the low-dielectric portion (the portion 14b and the portion 13b) interposed between the selected gate and the adjacent channel is expanded as compared with the above first embodiment, and hence interference between memory cells can be prevented more effectively. The configuration, operation, and effect of this variation other than the foregoing are the same as those of the above first embodiment.

Also in this variation, as viewed from above, that is, in the direction perpendicular to the upper surface of the semiconductor substrate 11, the boundary between the control gate electrode 15 and the intercellular dielectric film 16, the boundary between the portion 14a and the portion 14b in the charge block layer 14, and the boundary between the portion 13a and the portion 13b in the charge storage layer 13 do not necessarily need to be aligned with each other.

Next, a second variation of the first embodiment is described.

Figure 4:
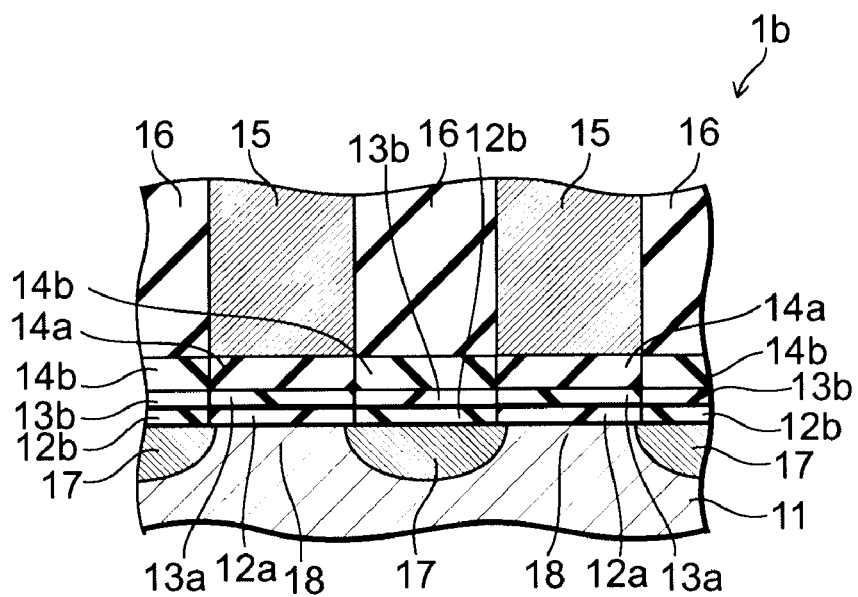
FIG. 4 is a cross-sectional view illustrating a NAND memory according to a second variation of the first embodiment, showing a cross section parallel to the channel length direction.

FIG. 4 is a cross-sectional view illustrating a NAND memory according to this variation, showing a cross section parallel to the channel length direction.

As shown in FIG. 4, in the NAND memory 1b according to this variation, not only in the charge block layer 14 and the charge storage layer 13 but also in the tunnel dielectric layer 12 is the dielectric constant different between the portion 12a immediately below the control gate electrode 15 and the portion 12b immediately below the intercellular dielectric film 16, and the portion 12b has a lower dielectric constant than the portion 12a. The method for making the dielectric constant of the portion 12b of the tunnel dielectric layer 12 lower than the dielectric constant of the portion 12a can be based on those similar to the methods for making the dielectric constant of the portion 14b of the charge block layer 14 lower than the dielectric constant of the portion 14a in the above first embodiment.

According to this variation, the low-dielectric portion (portions 14b, 13b, 12b) interposed between the selected gate and the adjacent channel is expanded as compared with the above first embodiment and the first variation thereof, and hence interference between memory cells can be prevented more effectively. The configuration, operation, and effect of this variation other than the foregoing are the same as those of the above first embodiment.

Also in this variation, as viewed from above, the boundary between the control gate electrode 15 and the intercellular dielectric film 16, the boundary between the portion 14a and the portion 14b in the charge block layer 14, the boundary between the portion 13a and the portion 13b in the charge storage layer 13, and the boundary between the portion 12a and the portion 12b in the tunnel dielectric layer 12 do not necessarily need to be aligned with each other.

Next, a first example of the first embodiment is described.

FIGS. 5A to 5C show a NAND memory according to this example, where FIG. 5A is a cross-sectional view parallel to the channel length direction (bit line direction), FIG. 5B is a cross-sectional view parallel to the channel width direction (word line direction), and FIG. 5C is a perspective view.

In FIG. 5C, for convenience of illustration, the intercellular dielectric film 114 is not shown.

As shown in FIGS. 5A to 5C, the NAND memory 100 according to this example is a horizontal-type flash memory. The NAND memory 100 includes a silicon substrate 101 illustratively made of p-type single crystal silicon. On the silicon substrate 101, a silicon oxynitride layer 102 serving as a tunnel dielectric layer, a silicon nitride layer 103 serving as a charge storage layer, and an alumina layer 104 serving as a charge block layer are stacked in this order, and a polycrystalline silicon layer 105 made of polycrystalline silicon doped with impurities is formed thereon.

In the stacked body of the silicon substrate 101, the silicon oxynitride layer 102, the silicon nitride layer 103, the alumina layer 104, and the polycrystalline silicon layer 105, from the upper surface side, device isolation trenches 107 having a striped configuration extending in the channel length direction (bit line direction) are periodically formed along the channel width direction (word line direction), and a silicon oxide film 108 is buried as a device isolation dielectric film in the device isolation trench 107. Thus, the upper portion of the silicon substrate 101, the silicon oxynitride layer 102, the silicon nitride layer 103, the alumina layer 104, and the polycrystalline silicon layer 105 are divided along the word line direction. Furthermore, the polycrystalline silicon layer 105 is divided also along the bit line direction. That is, the polycrystalline silicon layers 105 are arranged in a matrix configuration as viewed from above.

In the region of the upper portion of the silicon substrate 101 between the device isolation trenches 107, the region between the immediately underlying regions of the polycrystalline silicon layers 105 is doped with impurities to form an n-type diffusion region 112. Hence, as viewed from above, the diffusion regions 112 are arranged in a matrix configuration. In the upper portion of the silicon substrate 101 between the device isolation trenches 107, the region between the diffusion regions 112, that is, the region immediately below the polycrystalline silicon layer 105, serves as a channel region 113.

A conductive layer 109 extending in the word line direction is formed on the polycrystalline silicon layers 105 and the silicon oxide film 108 so as to interconnect the regions immediately above the polycrystalline silicon layers 105. The conductive layer 109 has a two-layer structure including a polycrystalline silicon layer (not shown) on the lower side and a tungsten silicide layer (not shown) on the upper side. The polycrystalline silicon layer 105 and the conductive layer 109 constitute a control gate electrode 111. Furthermore, a processing mask material 110 made of silicon nitride is provided immediately above the conductive layer 109. Moreover, an intercellular dielectric film 114 made of silicon oxide is provided on the entire surface so as to cover the control gate electrode 111 and the processing mask material 110.

In the NAND memory 100, the upper portion of the silicon substrate 101 partitioned by the device isolation trench 107 extends in the bit line direction, whereas the upper portion of the control gate electrode 111, that is, the conductive layer 109, extends in the word line direction. Thus, they are in a skew position. Furthermore, a memory film composed of the silicon oxynitride layer 102, the silicon nitride layer 103, and the alumina layer 104 is provided between the silicon substrate 101 and the control gate electrode 111. Thus, a cell transistor is formed for each nearest portion between the conductive layer 109 and the upper portion of the silicon substrate 101. As viewed from above, the cell transistors are arranged in a matrix configuration and connected in series along the bit line direction. Each cell transistor constitutes a memory cell. The silicon substrate 101 serves as a substrate for supporting the memory film composed of the silicon oxynitride layer 102, the silicon nitride layer 103, the alumina layer 104 as well as the control gate electrode 111 composed of the polycrystalline silicon layer 105 and the conductive layer 109.

In the alumina layer 104 (charge block layer), chlorine is added to the portion 104b immediately below the intercellular dielectric film 114, and not added to the portion 104a immediately below the polycrystalline silicon layer 105. That is, the portion 104b has a higher chlorine concentration than the portion 104a. Thus, the portion 104b has a lower dielectric constant than the portion 104a.

Next, a method for manufacturing a NAND memory according to this example is described.

Figure 6A:
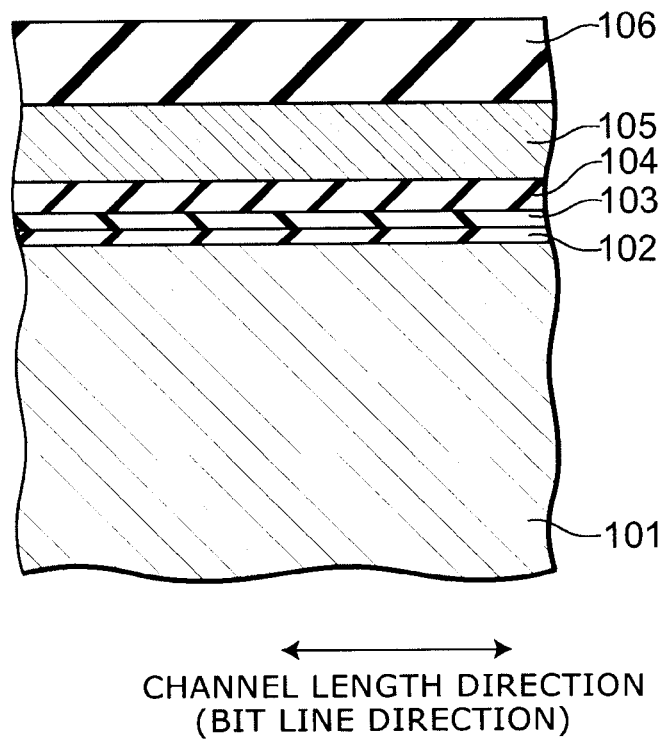
FIGS. 6A and 6B are process cross-sectional views illustrating a method for manufacturing a NAND memory according to the first example of the first embodiment.
Figure 6B:
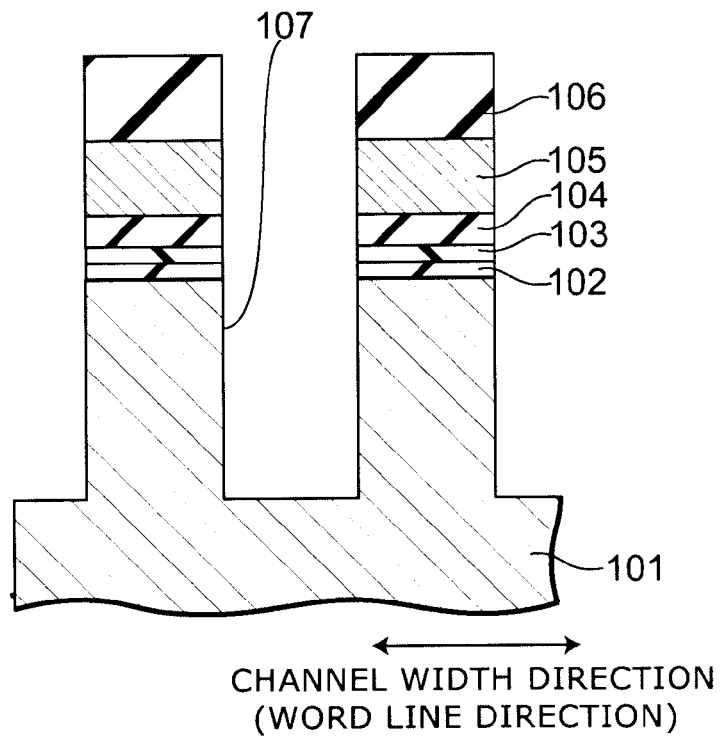
Figure 7A:
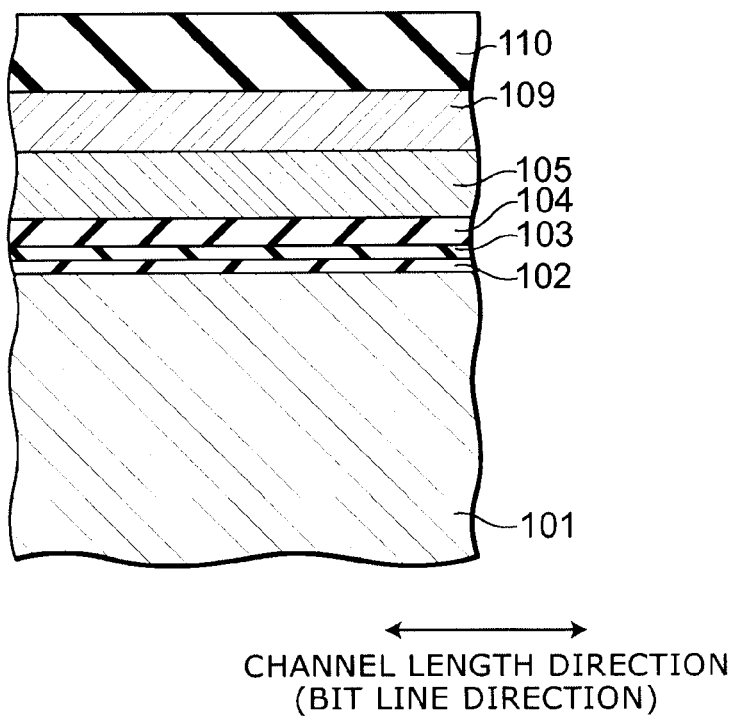
FIGS. 7A and 7B are process cross-sectional views illustrating a method for manufacturing a NAND memory according to the first example of the first embodiment.
Figure 7B:
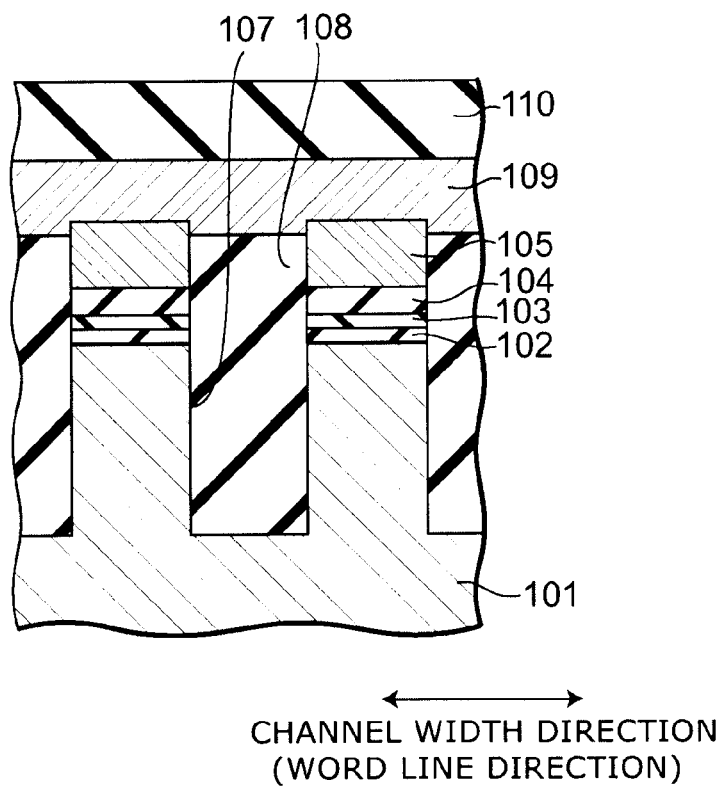
Figure 8A:
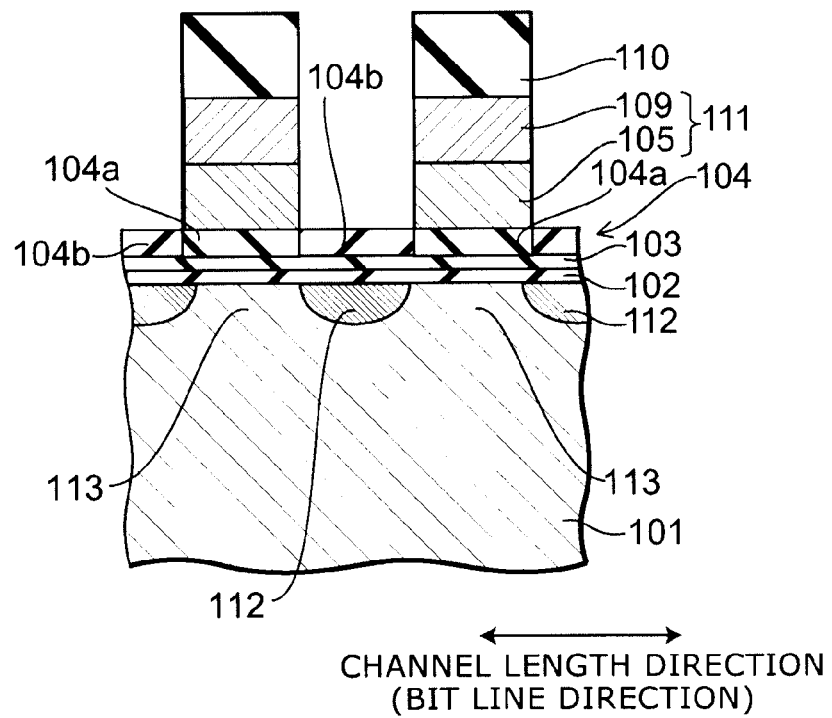
FIGS. 8A and 8B are process cross-sectional views illustrating a method for manufacturing a NAND memory according to the first example of the first embodiment.
Figure 8B:
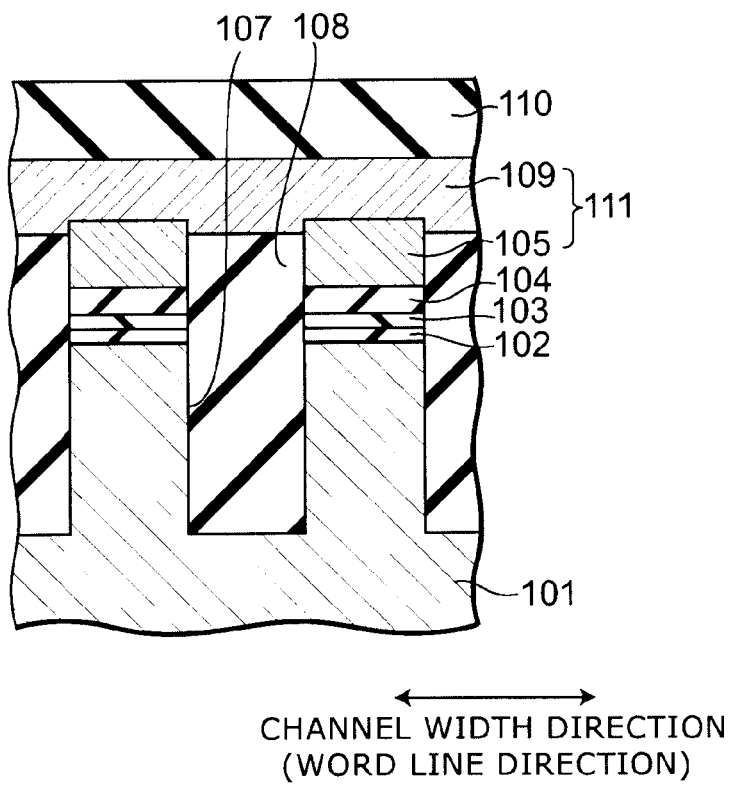

FIGS. 6A, 6B, 7A, 7B, 8A, and 8B are process cross-sectional views illustrating the method for manufacturing a NAND memory according to this example, where FIGS. 6A, 7A, and 8A show a cross section parallel to the channel length direction, and FIGS. 6B, 7B, and 8B show a cross section parallel to the channel width direction.

First, as shown in FIGS. 6A and 6B, a silicon substrate 101 doped with desired impurities is prepared. By performing thermal oxidation and thermal nitridation in combination, a silicon oxynitride layer 102 having a thickness of e.g. 5 nm is formed on the upper surface of the silicon substrate 101. The silicon oxynitride layer 102 serves as a tunnel dielectric layer of the NAND memory 100 (see FIG. 5).

Next, by CVD (chemical vapor deposition), a silicon nitride layer 103 having a thickness of e.g. 5 nm is deposited on the silicon oxynitride layer 102. The silicon nitride layer 103 serves as a charge storage layer of the NAND memory 100 (see FIG. 5).

Next, by ALD (atomic layer deposition), an alumina layer 104 having a thickness of e.g. 10 nm is deposited on the silicon nitride layer 103. The alumina layer 104 serves as a charge block layer of the NAND memory 100 (see FIG. 5).

Next, by CVD, a polycrystalline silicon layer 105 and a processing mask material 106 are deposited in this order on the alumina layer 104. The polycrystalline silicon layer 105 is formed from polycrystalline silicon doped with impurities and has a thickness of e.g. 30 nm. The polycrystalline silicon layer 105 constitutes a lower portion of the control gate electrode of the NAND memory 100.

Next, a resist mask (not shown) is formed on the processing mask material 106. This resist mask has a striped pattern extending in the channel length direction. Then, this resist mask is used as a mask to perform RIE (reactive ion etching) to pattern the processing mask material 106. Next, the resist mask is removed, and the processing mask material 106 patterned is used as a mask to perform etching to successively process the polycrystalline silicon layer 105, the alumina layer 104, the silicon nitride layer 103, and the silicon oxynitride layer 102, and etch away the upper portion of the exposed silicon substrate 101 to a depth of approximately 100 nm. Thus, a plurality of device isolation trenches 107 extending in the bit line direction are formed.

Next, as shown in FIGS. 7A and 7B, by coating and CMP (chemical mechanical polishing), a silicon oxide film 108 is buried in the device isolation trench 107. The silicon oxide film 108 serves as a device isolation dielectric film. Subsequently, the processing mask material 106 (see FIG. 6) is removed.

Next, by CVD, a polycrystalline silicon layer doped with impurities is deposited on the entire surface, and a tungsten silicide layer is consecutively deposited. Thus, a conductive layer 109 having a thickness of e.g. 50 nm and having a two-layer structure of the polycrystalline silicon layer and the tungsten silicide layer is formed on the polycrystalline silicon layer 105 and the silicon oxide film 108. The conductive layer 109 constitutes an upper portion of the control gate electrode. Next, silicon nitride is deposited by CVD to form a processing mask material 110 made of silicon nitride.

Next, as shown in FIGS. 8A and 8B, a resist mask (not shown) is formed on the processing mask material 110. This resist mask has a striped pattern extending in the word line direction. Then, this resist mask is used as a mask to perform RIE to pattern the processing mask material 110. Next, the resist mask is removed, and the processing mask material 110 patterned is used as a mask to perform RIE to successively process the conductive layer 109 and the polycrystalline silicon layer 105. Thus, control gate electrodes 111 extending in the word line direction and having a width and spacing of e.g. 50 nm are formed, in which the lower portion is made of the polycrystalline silicon layer 105, and the upper portion is made of the conductive layer 109. Here, the surface of the alumina layer 104 is exposed to the region between the control gate electrodes 111.

Next, the processing mask material 110 and the control gate electrodes 111 are used as a mask to ion-implant chlorine molecules ($Cl_2$) so that chlorine is selectively introduced into the portion 104b of the alumina layer 104 exposed to the region between the control gate electrodes 111. The amount of chlorine introduced is approximately $3 \times 10^{15}$ $cm^{-2}$ so that, for example, the decrease of dielectric constant of the portion 104b is approximately 10%. Furthermore, the acceleration energy of the chlorine molecular ion is approximately 10 keV so that, for example, the range of the chlorine molecular ion is located around the midpoint of the thickness of the alumina layer 104. Subsequently, heating is performed to a temperature of approximately 1000° C. so that chlorine introduced into the portion 104b is combined with alumina constituting the portion 104b. Thus, the dielectric constant of the portion 104b is decreased.

Next, the processing mask material 110 and the control gate electrodes 111 are used as a mask to ion-implant dopant impurities into the upper portion of the silicon substrate 101, followed by heat treatment, so that a diffusion region 112 is formed in the upper portion of the silicon substrate 101 between the immediately underlying regions of the control gate electrodes 111. Here, the region of the upper portion of the silicon substrate 101 between the diffusion regions 112, that is, the region immediately below the control gate electrode 111, serves as a channel region 113.

Next, as shown in FIGS. 5A and 5B, by CVD, silicon oxide is deposited on the entire surface to form an intercellular dielectric film 114 that entirely covers the stacked structure of the control gate electrode 111 and the processing mask material 110. Subsequently, interconnect layers and the like (not shown) are formed using known techniques. Thus, the NAND memory 100 according to this example is fabricated.

Next, the effect of this example is described.

In the NAND memory 100 according to this example, in the alumina layer 104 serving as a charge block layer, the portion 104b immediately below the intercellular dielectric film 114 has a lower dielectric constant than the portion 104a immediately below the polycrystalline silicon layer 105. Thus, by operation similar to that of the above first embodiment, in the NAND memory 100, the neighboring gate effect is reduced, and interference between memory cells is less likely to occur. Hence, memory malfunction due to threshold variation of the cell transistor is less likely to occur.

Furthermore, in the NAND memory 100 according to this example, the charge block layer and the charge storage layer are not divided, but formed as continuous layers, between adjacent memory cells. This serves to avoid gouging of the portion of the silicon substrate 101 where the diffusion region 112 is to be formed, as is the case where the charge block layer and the charge storage layer are divided by RIE. Thus, memory malfunction due to the short channel effect of the cell transistor can be reliably avoided. In particular, if the charge block layer or the charge storage layer is made of a material resistant to dry etching, e.g., a high-dielectric film such as an alumina film, then this dividing process is likely to etch away the tunnel dielectric film and the substrate surface, and the problem of substrate gouging becomes noticeable. However, according to this example, this problem does not occur.

It is noted that in this example, chlorine molecules are ion-implanted into the portion 104b of the alumina layer 104. However, the dose amount and the acceleration energy can be adjusted to ion-implant other chlorine-containing molecules. Higher molecular weight of the ion is preferable, because it facilitates controlling ions in a shallow range. Furthermore, higher molecular weight is preferable also because it causes significant damage to the charge block layer (alumina layer), which has the effect of increasing the combining efficiency during high-temperature heating. If there is no need to control ions in a shallow range, chlorine atoms can be ion-implanted. Alternatively, halogen elements other than chlorine or hydrogen may be ion-implanted. Further alternatively, argon or other noble gas elements or carbon may be ion-implanted. In particular, noble gas elements are preferable in that the diffusion thereof does not significantly degrade the characteristics of the surrounding dielectric film. Furthermore, in the case where the charge block layer is made of alumina, it is also possible to ion-implant a metal, such as silicon, having a lower dielectric constant than the metal constituting the base dielectric material.

In this example as illustrated, a halogen element is introduced into the portion 104b of the alumina layer 104 by ion implantation, but the invention is not limited thereto. For example, gas-phase diffusion may be used. Alternatively, during formation of the intercellular dielectric film 114, an intercellular dielectric film containing a large amount of halogen element may be formed by adding halogen gas to the source gas atmosphere or using a source gas containing a large amount of halogen element, and then subjected to heat treatment, so that the halogen element may be solid-phase diffused into the portion 104b. For example, an intercellular dielectric film 114 containing chlorine at approximately 10 atomic % can be formed by forming a silicon oxide film using a plasma CVD method based on chlorine gas, silane gas, and nitrous oxide gas, or a plasma CVD method based on silicon tetrachloride gas and nitrous oxide gas, and then subjected to heat treatment, so that chlorine can be introduced into the portion 104b at a concentration of 1 atomic % or more.

Likewise, hydrogen, a noble gas element, or carbon, or a low-dielectric metallic element can be contained in the intercellular dielectric film 114 and introduced into the portion 104b by solid-phase diffusion. This is free from degradation in the film quality of layers constituting the memory film or degradation in the crystallinity of the silicon substrate 101, and a memory cell with superior operating characteristics and reliability can be realized.

Instead of solid-phase diffusion of a halogen element or the like from the intercellular dielectric film 114 into the portion 104b, a high-dielectric metallic element may be solid-phase diffused from the control gate electrode 111 into the portion 104a. For example, in forming the polycrystalline silicon layer 105 or the conductive layer 109 constituting the control gate electrode 111, a control gate electrode containing a large amount of high-dielectric metal may be formed by adding a gas containing a high-dielectric metallic element such as tantalum (Ta), hafnium (Hf), zirconium (Zr), or lanthanum (La) to the source gas atmosphere, or using a source gas containing a high-dielectric metallic element, and then subjected to heat treatment, so that the high-dielectric metallic element contained in the control gate electrode may be solid-phase diffused into the portion 104a of the alumina layer 104.

The amount of element introduced in this case is also preferably 1 to 30 atomic % in average concentration. This can increase the dielectric constant of the portion 104a by a factor of approximately 1.01 to 2. The average concentration of high-dielectric metal in the portion 104a being set to 1 atomic % or more serves to increase the dielectric constant of the portion 104a interposed between the selected gate and the selected channel and increase the physical thickness of the alumina layer 104. This can further increase the ratio of the capacitance between the selected gate and the selected channel to the capacitance between the selected gate and the adjacent channel, and hence reduce the neighboring gate effect more reliably. On the other hand, the average concentration of high-dielectric metal in the portion 104a being set to 30 atomic % or less serves to ensure insulation of the portion 104a, thereby reliably preventing malfunction due to dielectric breakdown failure and charge leakage.

The NAND memory according to the first and second variation of the above first embodiment can also be manufactured by a method similar to that of this example. In this case, the dose amount and the acceleration energy for ion implantation of a halogen element can be suitably selected to selectively introduce the halogen element also into the portion 13b of the charge storage layer 13 and the portion 12b of the tunnel dielectric layer 12. Alternatively, a halogen element can be introduced into the intercellular dielectric film and solid-phase diffused into the portion 14b, the portion 13b, and the portion 12b by suitably selecting the condition of subsequent heat treatment. Further alternatively, a halogen element or the like can be contained in the portion 14b of the charge block layer 14 and solid-phase diffused into the portion 13b of the charge storage layer 13 and the portion 12b of the tunnel dielectric layer 12. Further alternatively, a halogen element or the like can be contained in the portion 13b of the charge storage layer 13 and solid-phase diffused into the portion 14b of the charge block layer 14 and the portion 12b of the tunnel dielectric layer 12. Thus, the halogen element or the like can be selectively introduced into the surface of the portion 14b and the portion 12b.

Alternatively, a high-dielectric metallic element may be introduced into the control gate electrode and solid-phase diffused into the portion 14a, the portion 13a, and the portion 12a by suitably selecting the condition of subsequent heat treatment. Further alternatively, a high-dielectric metallic element may be contained in the portion 13a of the charge storage layer 13 and solid-phase diffused into the portion 14a of the charge block layer 14 and the portion 12a of the tunnel dielectric layer 12. Thus, a high-dielectric metallic element can be selectively introduced into the surface of the portion 14a and the portion 12a. Consequently, in the charge storage layer 13 and the tunnel dielectric layer 12, the dielectric constant of the portion immediately below the intercellular dielectric film can be made lower than the dielectric constant of the portion immediately below the control gate electrode.

Furthermore, the silicon oxynitride layer 102 serving as a tunnel dielectric layer, the silicon nitride layer 103 serving as a charge storage layer, and the alumina layer 104 serving as a charge block layer may be all formed by ALD.

Next, a second example of the first embodiment is described.

Figure 9A:
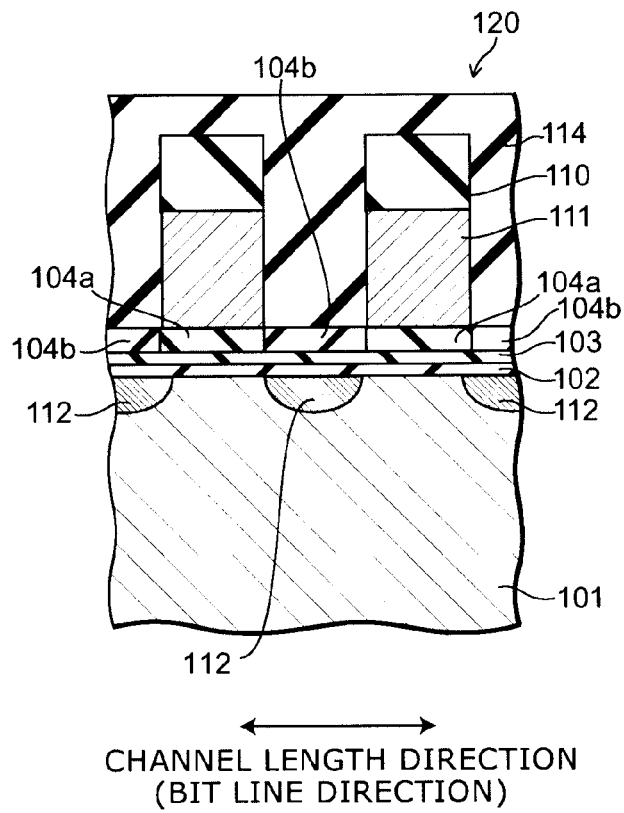
FIGS. 9A and 9B show a NAND memory according to a second example of the first embodiment.
Figure 9B:
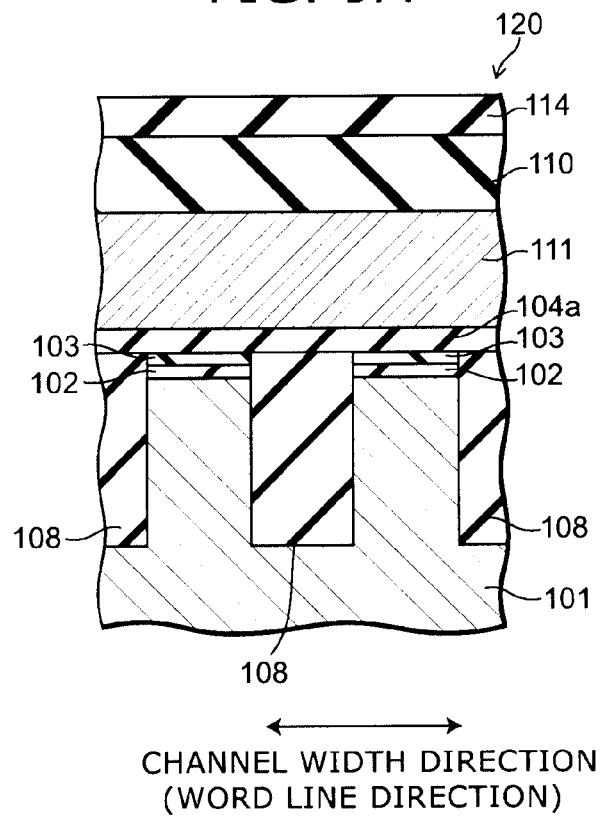

FIGS. 9A and 9B show a NAND memory according to this example, where FIG. 9A is a cross-sectional view parallel to the channel length direction (bit line direction), and FIG. 9B is a cross-sectional view parallel to the channel width direction (word line direction).

As shown in FIGS. 9A and 9B, in the NAND memory 120 according to this example, the alumina layer 104 is not divided in the bit line direction or in the word line direction, but spread two-dimensionally. Furthermore, the control gate electrode 111 is divided only along the channel length direction (bit line direction), and each divided portion extends in the channel width direction (word line direction). Thus, in contrast to the above first example (see FIG. 5), the polycrystalline silicon layers 105 are not arranged in a matrix configuration as viewed from above. Even this structure can achieve the same effect as the above first example.

Next, a method for manufacturing a NAND memory according to this example is described.

Figure 10A:
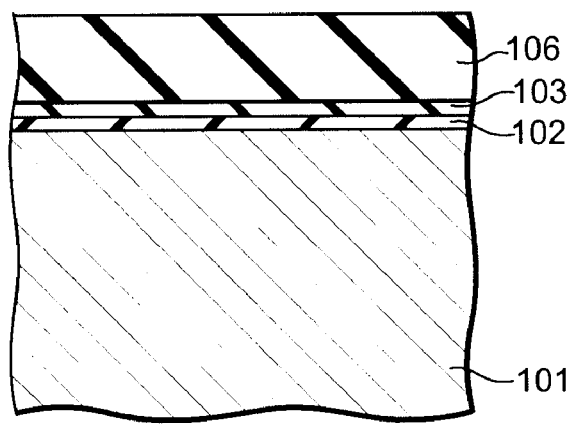
FIGS. 10A and 10B are process cross-sectional views illustrating a method for manufacturing a NAND memory according to the second example of the first embodiment.
Figure 10B:
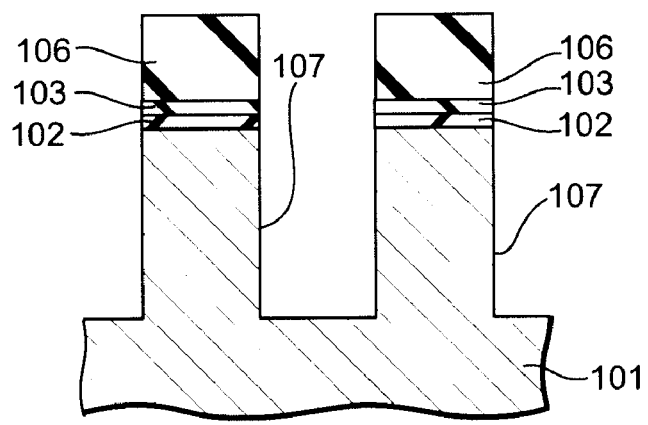
Figure 11A:
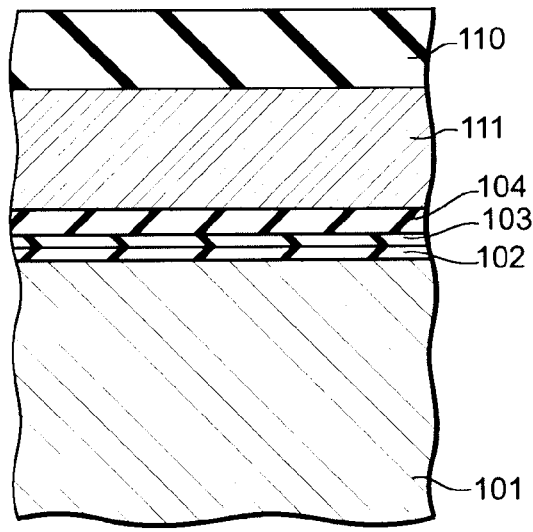
FIGS. 11A and 11B are process cross-sectional views illustrating a method for manufacturing a NAND memory according to the second example of the first embodiment.
Figure 11B:
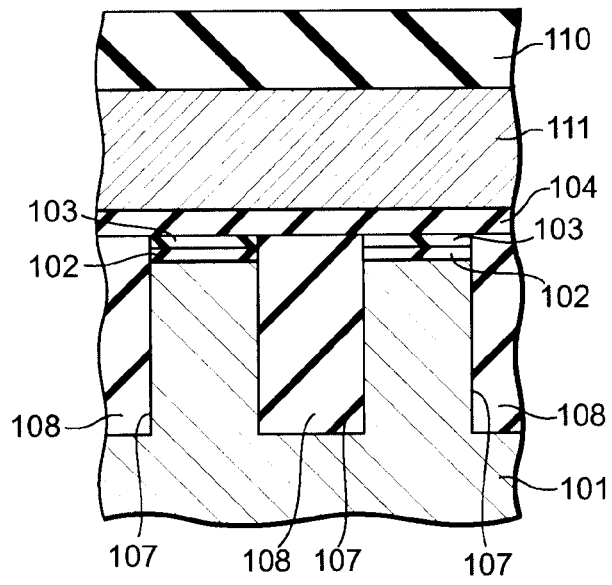
Figure 12A:
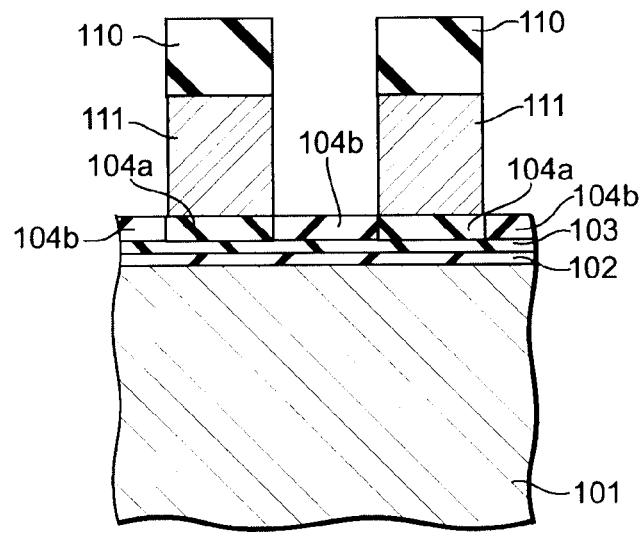
FIGS. 12A and 12B are process cross-sectional views illustrating a method for manufacturing a NAND memory according to the second example of the first embodiment.
Figure 12B:
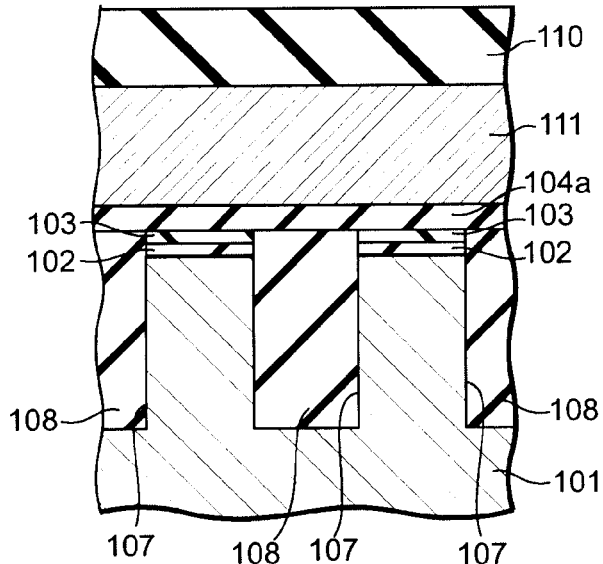

FIGS. 10A, 10B, 11A, 11B, 12A, and 12B are process cross-sectional views illustrating the method for manufacturing a NAND memory according to this example, where FIGS. 10A, 11A, and 12A show a cross section parallel to the channel length direction, and FIGS. 10B, 11B, and 12B show a cross section parallel to the channel width direction.

First, as shown in FIGS. 10A and 10B, a silicon substrate 101 doped with desired impurities is prepared. Then, a silicon oxynitride layer 102 is formed on the upper surface of the silicon substrate 101. Next, by CVD, a silicon nitride layer 103 having a thickness of e.g. 5 nm is deposited on the silicon oxynitride layer 102. Next, a processing mask material 106 is deposited on the silicon nitride layer 103.

Next, a resist mask (not shown) is formed on the processing mask material 106. This resist mask has a striped pattern extending in the channel length direction. Then, this resist mask is used as a mask to perform RIE to pattern the processing mask material 106. Next, the resist mask is removed, and the processing mask material 106 patterned is used as a mask to perform etching to successively process the silicon nitride layer 103 and the silicon oxynitride layer 102, and etch away the upper portion of the exposed silicon substrate 101 to a depth of approximately 100 nm. Thus, a plurality of device isolation trenches 107 extending in the bit line direction are formed.

Next, as shown in FIGS. 11A and 11B, by coating and CMP, a silicon oxide film 108 is buried in the device isolation trench 107. Subsequently, the processing mask material 106 (see FIG. 10) is removed.

Next, by ALD, an alumina layer 104 having a thickness of e.g. 10 nm is deposited on the silicon nitride layer 103 and the silicon oxide film 108. Next, by CVD, a polycrystalline silicon layer doped with impurities is deposited on the entire surface to form a control gate electrode 111. Next, silicon nitride is deposited by CVD to form a processing mask material 110 made of silicon nitride.

Next, as shown in FIGS. 12A and 12B, the processing mask material 110 is patterned into a striped configuration extending in the word line direction, and used as a mask to perform RIE to process the control gate electrode 111. Thus, control gate electrodes 111 extending in the word line direction are formed. Here, the surface of the alumina layer 104 is exposed to the region between the control gate electrodes 111.

Next, the processing mask material 110 and the control gate electrodes 111 are used as a mask to ion-implant chlorine molecules ($Cl_2$) so that chlorine is selectively introduced into the portion 104b of the alumina layer 104 exposed to the region between the control gate electrodes 111. Thus, the dielectric constant of the portion 104b is decreased. Subsequently, a method similar to that of the above first example is used to form a diffusion region 112 and the like and cover the structure with an intercellular dielectric film 114. Thus, the NAND memory 120 according to this example is fabricated.

Next, a third example of the first embodiment is described.

Figure 13:
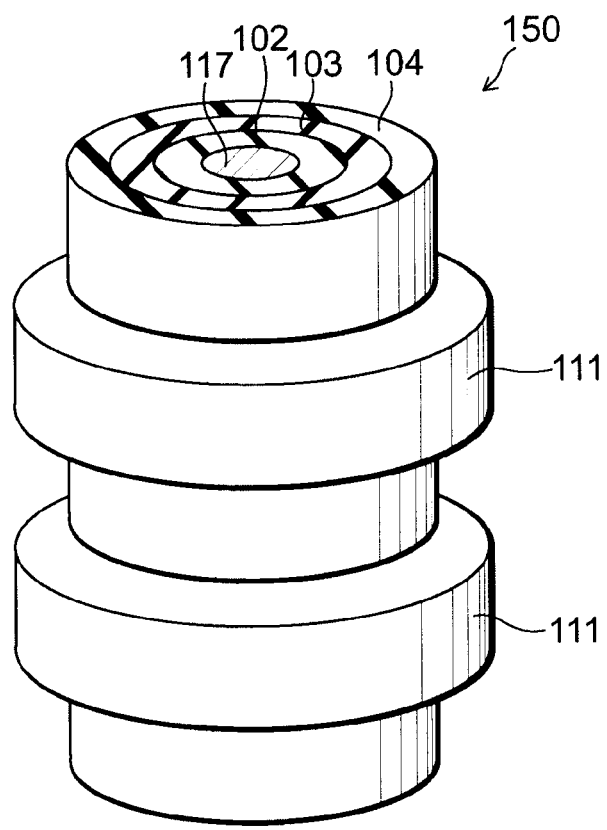
FIG. 13 is a perspective view illustrating a NAND memory according to a third example of the first embodiment.

FIG. 13 is a perspective view illustrating a NAND memory according to this example.

Figure 14:
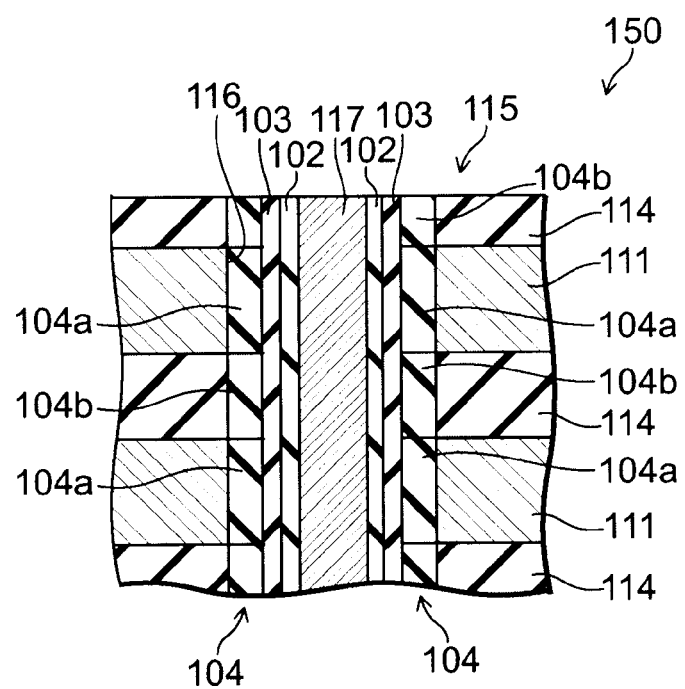
FIG. 14 is a cross-sectional view illustrating the NAND memory according to the third example of the first embodiment, showing a cross section parallel to the stacking direction of control gate electrodes.

FIG. 14 is a cross-sectional view illustrating the NAND memory according to this example, showing a cross section parallel to the stacking direction of control gate electrodes.

In FIG. 13, for convenience of illustration, the intercellular dielectric film 114 is not shown.

As shown in FIGS. 13 and 14, the NAND memory 150 according to this example is a vertical-type flash memory. In the NAND memory 150, a plurality of intercellular dielectric films 114 and control gate electrodes 111 are alternately stacked on a substrate (not shown) to constitute a stacked body 115. A through hole 116 extending in the stacking direction is formed in the stacked body 115 and penetrates through the plurality of control gate electrodes 111 and the plurality of intercellular dielectric films 114 constituting the stacked body 115. On the side surface of the through hole 116, an alumina layer 104 serving as a charge block layer, a silicon nitride layer 103 serving as a charge storage layer, and a silicon oxynitride layer 102 serving as a tunnel dielectric layer are stacked in this order. Furthermore, in the through hole 116 is provided a silicon pillar 117 illustratively made of polycrystalline silicon and shaped like a column, such as a cylindrical column, extending in the stacking direction. The silicon oxynitride layer 102 is in contact with the silicon pillar 117.

In the NAND memory 150, a plurality of cell transistors are formed along the stacking direction of the control gate electrodes 111, that is, the extending direction of the silicon pillar 117. Here, the silicon pillar 117 serves as a channel region of the cell transistors. Each cell transistor constitutes a memory cell. Thus, the stacking direction of the control gate electrodes 111 is the channel length direction. It is noted that the silicon pillar 117 corresponds to the semiconductor substrate 11 in the above first embodiment (see FIG. 1).

In the alumina layer 104, the portion 104b between the silicon pillar 117 and the intercellular dielectric film 114 has a lower dielectric constant than the portion 104a between the silicon pillar 117 and the control gate electrode 111. Methods for making the dielectric constant of the portion 104b of the alumina layer 104 lower than the dielectric constant of the portion 104a illustratively include, as described in the above first example, the method of allowing the intercellular dielectric film 114 to contain a halogen element, which is solid-phase diffused into the portion 104b by heat treatment, and the method of allowing the control gate electrode 111 to contain a high-dielectric metallic element, which is solid-phase diffused into the portion 104a by heat treatment.

In such solid-phase diffusion, in contrast to the case of using ion implantation, there is no degradation in the quality of the dielectric film due to knock-on of constituent elements of the dielectric film during ion implantation, or degradation in the crystallinity of the substrate. Thus, it is possible to realize a NAND memory including memory cells with favorable operating characteristics and reliability. It is noted that hydrogen, halogen elements other than chlorine, noble gas elements such as argon, or carbon, or low-dielectric metallic elements may be illustratively introduced into the portion 104b by solid-phase diffusion.

According to this example, by operation similar to that of the above first embodiment, the neighboring gate effect can be reduced, and interference between memory cells can be prevented. As described in the first to third example, the above first embodiment is applicable to both the horizontal-type NAND memory and the vertical-type NAND memory. As described in the first and second example, in the case where the nonvolatile semiconductor memory device according to the first embodiment is configured as a horizontal-type memory, the semiconductor substrate 11 as a semiconductor member is the silicon substrate 101 for supporting the memory film and the control gate electrode. It is noted that the silicon substrate 101 is made of a semiconductor only in its upper portion. On the other hand, as described in the third example, in the case where the nonvolatile semiconductor memory device according to the first embodiment is configured as a vertical-type memory, the semiconductor substrate 11 is the silicon pillar 17. The same also applies to the first and second variation of the above first embodiment, and the embodiments and the variations thereof described below.

Next, a second embodiment of the invention is described.

Figure 15:
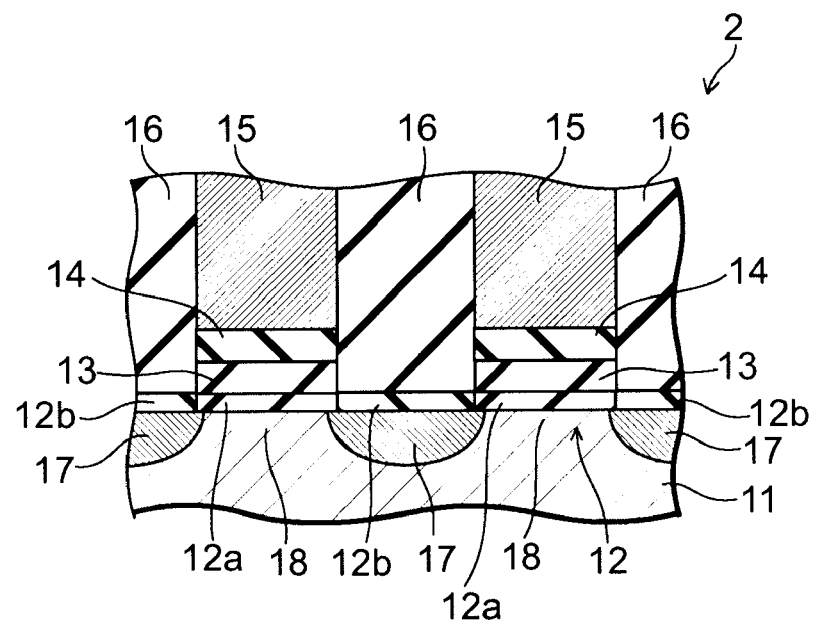
FIG. 15 is a cross-sectional view illustrating a NAND memory according to a second embodiment of the invention, showing a cross section parallel to the channel length direction.

FIG. 15 is a cross-sectional view illustrating a NAND memory according to this embodiment, showing a cross section parallel to the channel length direction.

As shown in FIG. 15, in the NAND memory 2 according to this embodiment, the charge storage layer 13 and the charge block layer 14 are divided along the channel length direction (bit line direction) and provided only immediately below the control gate electrode 15. An intercellular dielectric film 16 enters between the stacked bodies composed of the charge storage layers 13 and the charge block layers 14 thus divided.

The tunnel dielectric layer 12 is continuously provided along the channel length direction. However, in the tunnel dielectric layer 12, the portion 12a immediately below the control gate electrode 15 is different in dielectric constant from the portion 12b immediately below the intercellular dielectric film 16, and the portion 12b has a lower dielectric constant than the portion 12a. The method for making the dielectric constant of the portion 12b lower than the dielectric constant of the portion 12a can be based on those similar to the methods for making the dielectric constant of the portion 14b of the charge block layer 14 lower than the dielectric constant of the portion 14a in the above first embodiment.

This embodiment can also effectively prevent interference between memory cells by operation similar to that of the above first embodiment. Furthermore, interference between memory cells can be prevented more effectively by selecting materials so that the intercellular dielectric film 16 has a lower dielectric constant than the charge storage layer 13 and the charge block layer 14.

In this embodiment, because the charge storage layer 13 is divided along the channel length direction, the charge stored in the charge storage layer 13 of one memory cell does not migrate to the charge storage layer 13 of the adjacent memory cell. This also serves to prevent interference between memory cells.

In this embodiment, the boundary between the portion 12a and the portion 12b in the tunnel dielectric layer 12 does not necessarily need to be located immediately below the boundary between the control gate electrode 15 and the intercellular dielectric film 16, but may be displaced toward either the control gate electrode 15 or the intercellular dielectric film 16. However, the neighboring gate effect can be reduced more effectively in the case where the boundary is displaced toward the control gate electrode 15, that is, the portion 12b has a larger width in the channel length direction than the intercellular dielectric film 16. The configuration, operation, and effect of this embodiment other than the foregoing are the same as those of the above first embodiment.

Next, a comparative example of the second embodiment is described.

Figure 16:
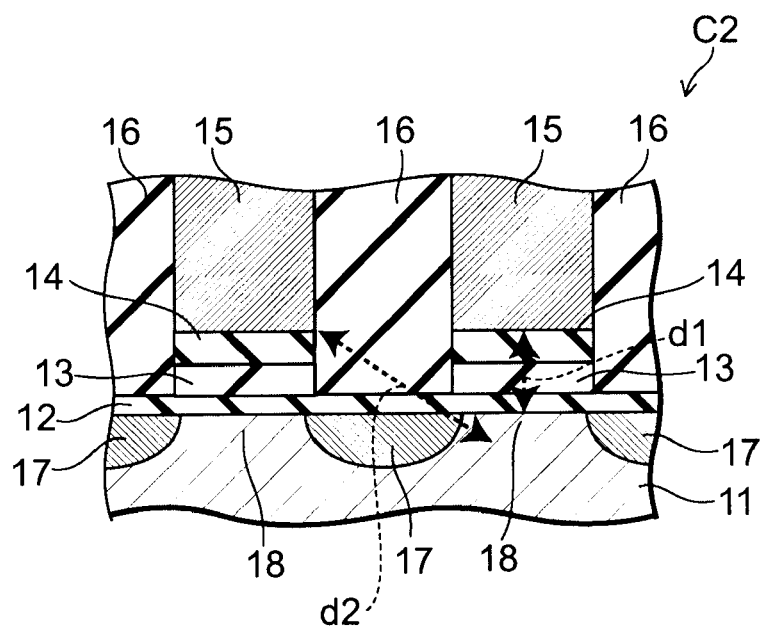
FIG. 16 is a cross-sectional view illustrating a NAND memory according to a comparative example of the second embodiment, showing a cross section parallel to the channel length direction.

FIG. 16 is a cross-sectional view illustrating a NAND memory according to this comparative example, showing a cross section parallel to the channel length direction.

As shown in FIG. 16, in the NAND memory C2 according to this comparative example, the tunnel dielectric layer 12 does not include the portion 12a and the portion 12b (see FIG. 15) having different dielectric constants, but is entirely uniform in dielectric constant. Thus, if the ratio d2/d1 decreases with the downscaling of the NAND memory C2, the neighboring gate effect occurs and causes interference between memory cells.

Next, a third embodiment of the invention is described.

Figure 17:
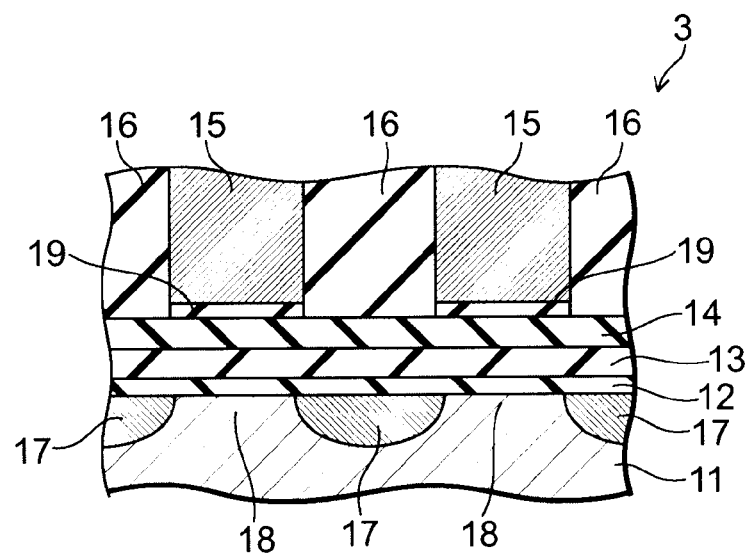
FIG. 17 is a cross-sectional view illustrating a NAND memory according to a third embodiment, showing a cross section parallel to the channel length direction.

FIG. 17 is a cross-sectional view illustrating a NAND memory according to this embodiment, showing a cross section parallel to the channel length direction.

As shown in FIG. 17, the NAND memory 3 according to this embodiment is different from the NAND memory 1 according to the above first embodiment (see FIG. 1) in that the charge block layer 14 does not include the portion 14a and the portion 14b (see FIG. 1), but is entirely uniform in composition.

Furthermore, a dielectric layer 19 is provided between the charge block layer 14 and the control gate electrode 15. The dielectric layer 19 is not provided between the charge block layer 14 and the intercellular dielectric film 16. Thus, the lower surface of the control gate electrode 15 is located more distant from the semiconductor substrate 11 by the thickness of the dielectric layer 19 than the lower surface of the intercellular dielectric film 16. In other words, the intercellular dielectric film 16 protrudes downward, that is, toward the semiconductor substrate 11, relative to the control gate electrode 15. The intercellular dielectric film 16 enters between the dielectric layers 19 and separates the dielectric layers 19 from each other. The material, composition ratio, film density, amount of impurities contained in the film and the like are selected so that the dielectric layer 19 has a higher dielectric constant than the intercellular dielectric film 16.

In this embodiment, in addition to the tunnel dielectric layer 12, the charge storage layer 13, and the charge block layer 14, the dielectric layer 19 having a relatively high dielectric constant is interposed between the control gate electrode 15 of the selected memory cell and the selected channel region 18. Hence, the electrical effect of the control gate electrode 15 exerted on the channel region 18 is relatively large. On the other hand, in addition to the tunnel dielectric layer 12, the charge storage layer 13, and the charge block layer 14, the intercellular dielectric film 16 having a relatively low dielectric constant is interposed between the control gate electrode 15 of the selected memory cell and the adjacent channel region 18. Hence, the electrical effect of the control gate electrode 15 exerted on the adjacent channel region 18 is relatively small. Consequently, the neighboring gate effect can be reduced, and interference between memory cells can be prevented. For example, memory malfunction due to threshold voltage variation of the cell transistor can be avoided. The configuration, operation, and effect of this embodiment other than the foregoing are the same as those of the above first embodiment.

Although FIG. 17 illustratively shows nothing between the charge block layer 14 and the intercellular dielectric film 16, this embodiment is not limited thereto. For example, even a dielectric layer having the same composition as the dielectric layer 19 can be provided between the charge block layer 14 and the intercellular dielectric film 16 as long as it has a sufficiently smaller thickness than the dielectric layer 19. Also in this case, the same effect as that of this embodiment can be achieved.

Next, an example of the third embodiment is described.

Figure 18:
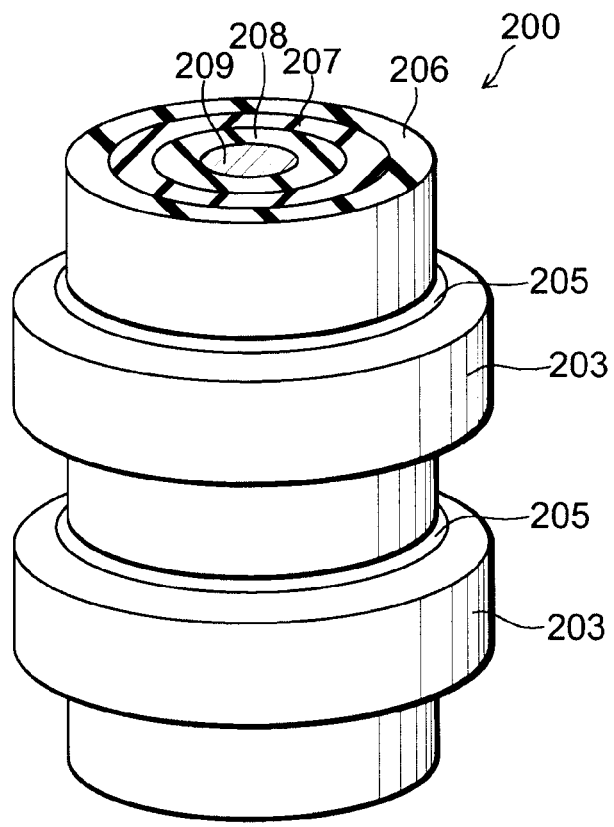
FIG. 18 is a perspective view illustrating a NAND memory according to an example of the third embodiment.

FIG. 18 is a perspective view illustrating a NAND memory according to this example.

Figure 19A:
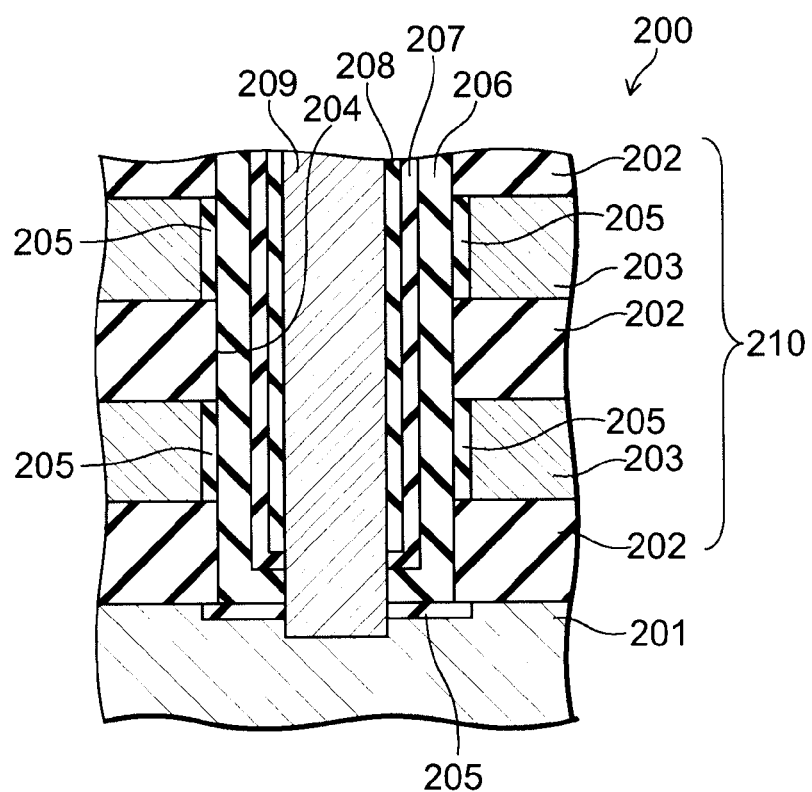
FIGS. 19A and 19B illustrate the NAND memory according to the example of the third embodiment.
Figure 19B:
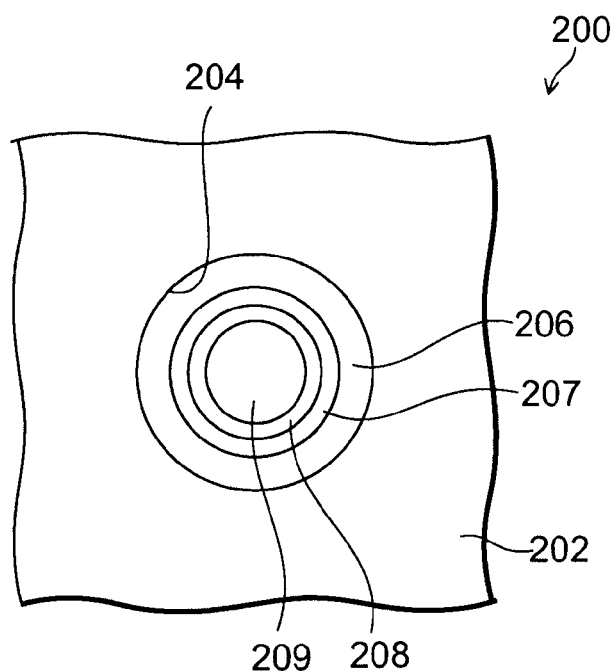

FIGS. 19A and 19B illustrate the NAND memory according to this example, where FIG. 19A is a cross-sectional view parallel to the vertical direction, and FIG. 19B is a plan view as viewed from above.

In FIG. 18, for convenience of illustration, the intercellular dielectric film 202 (see FIG. 19) is not shown. Furthermore, although the number of silicon films 203 is illustratively two in FIGS. 18 and 19, the number of silicon films 203 is arbitrary.

As shown in FIGS. 18, 19A, and 19B, the NAND memory 200 according to this example is a vertical-type flash memory similar to the third example of the above first embodiment (see FIGS. 13 and 14). In the NAND memory 200, a multiple-stacked structure 210 is provided on a silicon substrate 201. In the multiple-stacked structure 210, a plurality of silicon oxide films 202 and silicon films 203 are stacked along the vertical direction, that is, the direction perpendicular to the upper surface of the silicon substrate 201. The silicon film 203 is formed from silicon doped with an impurity element. The silicon oxide film 202 serves as an intercellular dielectric film of the NAND memory 200, and the silicon film 203 serves as a control gate electrode.

A cylindrical through hole 204 extending in the vertical direction, that is, the stacking direction of the multiple-stacked structure 210, is formed in the multiple-stacked structure 210. The through hole 204 penetrates through the multiple-stacked structure 210 and reaches the silicon substrate 201. The through hole 204 has a diameter of e.g. 60 nm.

On the side surface of the through hole 204, an alumina layer 206 serving as a charge block layer and having a thickness of e.g. 10 nm, a silicon nitride layer 207 serving as a charge storage layer and having a thickness of e.g. 5 nm, and a silicon oxide layer 208 serving as a tunnel dielectric layer and having a thickness of e.g. 5 nm are stacked in this order. Furthermore, inside the through hole 204 is buried a silicon pillar 209 illustratively made of polycrystalline silicon doped with impurities and shaped like a cylindrical column.

Furthermore, a silicon nitride layer 205 is formed between the alumina layer 206 and the silicon film 203. The silicon nitride layer 205 corresponds to the dielectric layer 19 in the above third embodiment (see FIG. 17). The silicon nitride layer 205 has a thickness of e.g. 2 nm. On the other hand, the silicon nitride layer 205 is not formed between the alumina layer 206 and the silicon oxide film 202. Hence, as viewed from the silicon pillar 209, the silicon film 203 is located more distant than the silicon oxide film 202 by the thickness of the silicon nitride layer 205. Furthermore, the silicon nitride layer 205 has a higher dielectric constant than the silicon oxide film 202 serving as an intercellular dielectric film. It is noted that the silicon nitride layer 205 is formed also between the silicon substrate 201 and the alumina layer 206.

Next, a method for manufacturing a NAND memory according to this example is described.

Figure 20A:
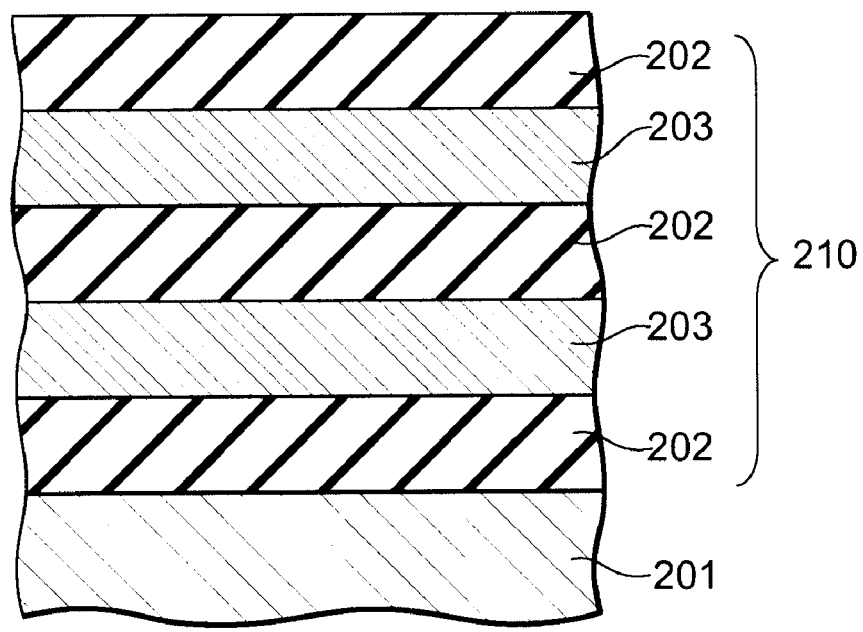
FIGS. 20A and 20B are process cross-sectional views illustrating a method for manufacturing a NAND memory according to the example of the third embodiment.
Figure 20B:
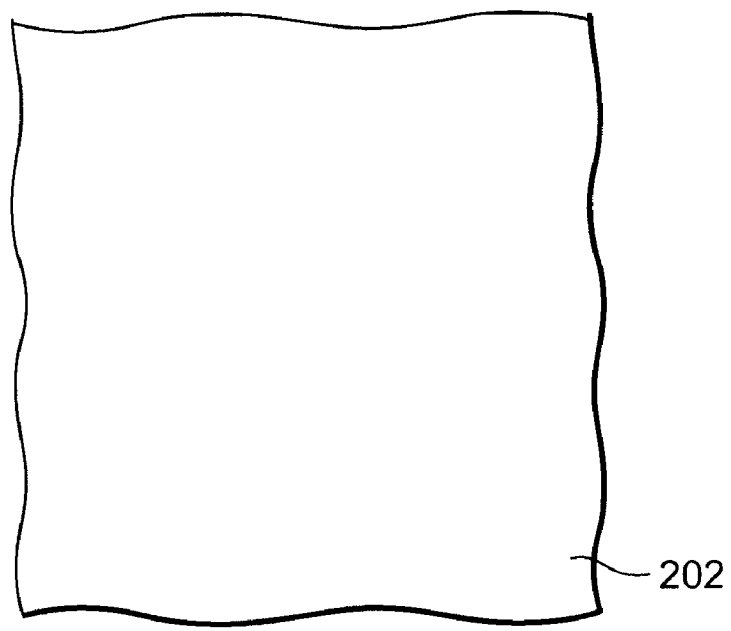
Figure 21A:
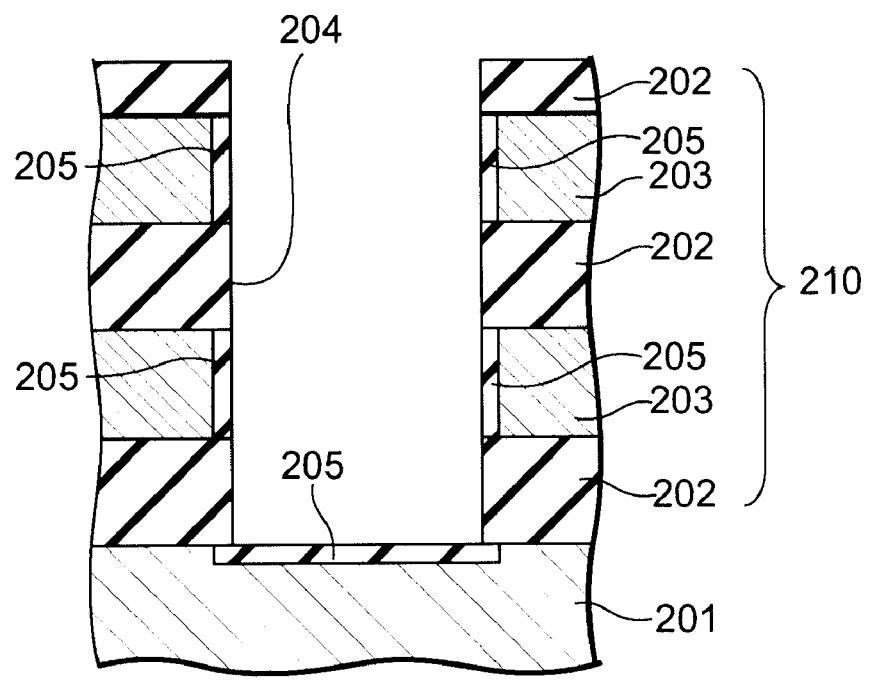
FIGS. 21A and 21B are process cross-sectional views illustrating a method for manufacturing a NAND memory according to the example of the third embodiment.
Figure 21B:
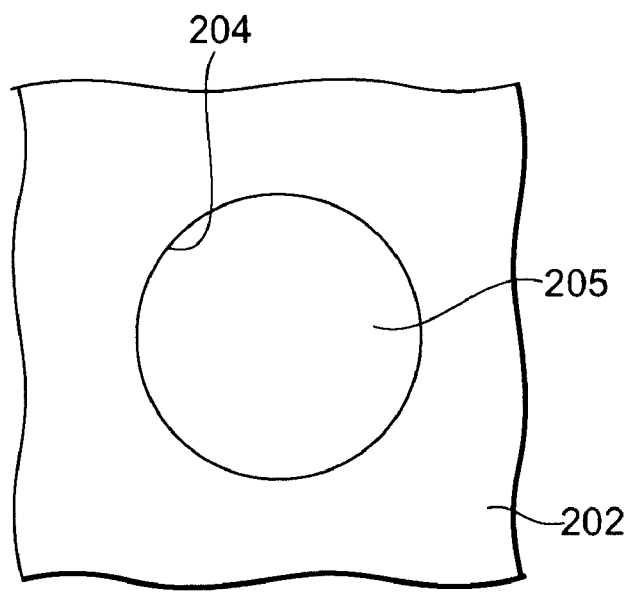
Figure 22A:
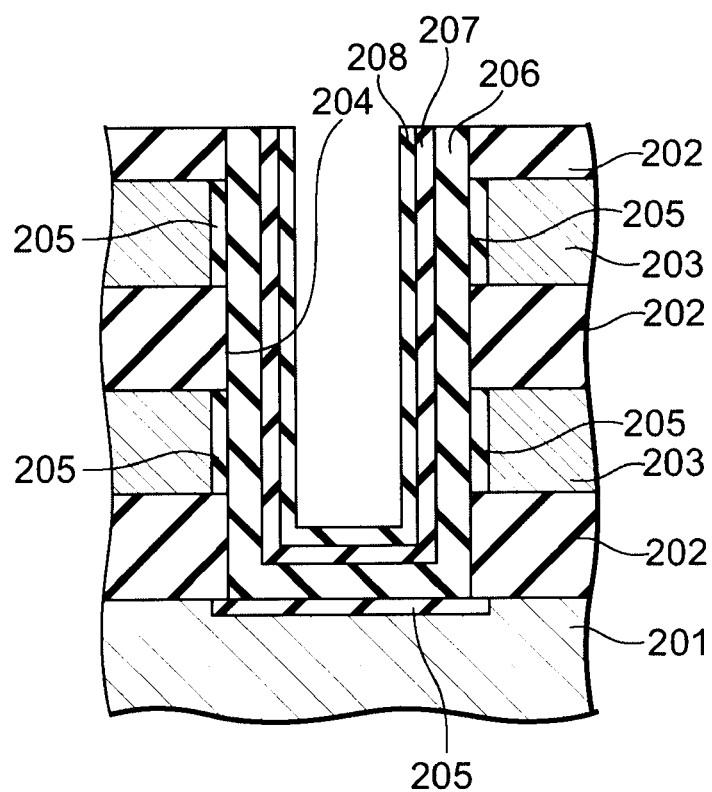
FIGS. 22A and 22B are process cross-sectional views illustrating a method for manufacturing a NAND memory according to the example of the third embodiment.
Figure 22B:
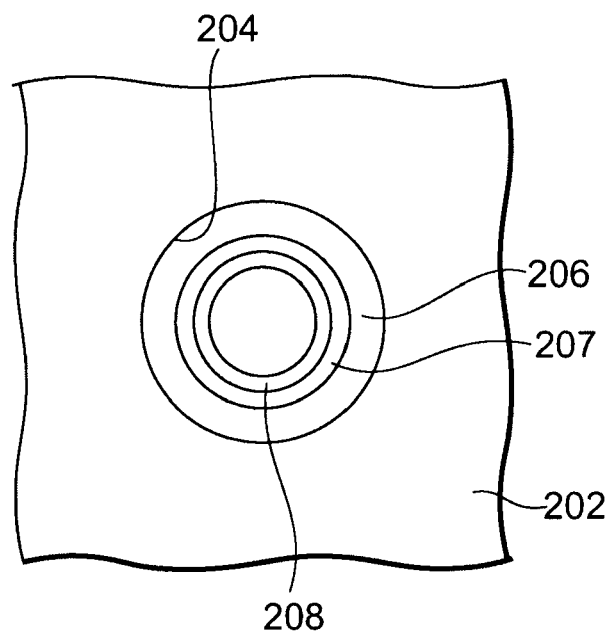

FIGS. 20A, 20B, 21A, 21B, 22A, and 22B are process cross-sectional views illustrating the method for manufacturing a NAND memory according to this example, where FIGS. 20A, 21A, and 22A are cross-sectional views parallel to the vertical direction, and FIGS. 20B, 21B, and 22B are plan views as viewed from above.

First, as shown in FIGS. 20A and 20B, a silicon substrate 201 is prepared. Then, on the silicon substrate 201, silicon oxide films 202 serving as intercellular dielectric films and silicon films 203 serving as control gate electrodes are alternately deposited by CVD to form a multiple-stacked structure 210. Here, the silicon film 203 is illustratively formed from polycrystalline silicon doped with impurities. Each of the silicon oxide film 202 and the silicon film 203 has a thickness of e.g. 50 nm.

Next, as shown in FIGS. 21A and 21B, a resist mask (not shown) is formed on the multiple-stacked structure 210. Next, this resist mask is used as a mask to perform RIE to selectively etch away the multiple-stacked structure 210 so that the upper surface of the silicon substrate 201 is exposed. Thus, a cylindrical through hole 204 extending in the vertical direction, reaching the silicon substrate 201, and having a diameter of e.g. 60 nm is formed in the multiple-stacked structure 210.

Next, thermal nitridation is performed in an ammonia gas atmosphere or nitric monoxide gas atmosphere. Thus, the exposed portion of the silicon films 203 and the silicon substrate 201 is selectively nitridized to form a silicon nitride layer 205 having a thickness of e.g. 2 nm. Thus, as viewed from inside the through hole 204, the side surface of the silicon film 203 is set back from the side surface of the silicon oxide film 202 by the thickness of the silicon nitride layer 205.

Next, as shown in FIGS. 22A and 22B, by ALD, on the inner surface of the through hole 204, an alumina layer 206 having a thickness of e.g. 10 nm, a silicon nitride layer 207 having a thickness of e.g. 5 nm, and a silicon oxide layer 208 having a thickness of e.g. 5 nm are formed in this order. As described above, the alumina layer 206 serves as a charge block layer, the silicon nitride layer 207 serves as a charge storage layer, and the silicon oxide layer 208 serves as a tunnel dielectric layer.

Next, as shown in FIGS. 19A and 19B, a resist mask (not shown) is formed on the multiple-stacked structure 210 and on the inner surface of the through hole 204, and used as a mask to perform RIE. Thus, the silicon oxide layer 208, the silicon nitride layer 207, the alumina layer 206, and the silicon nitride layer 205 are selectively removed from the center portion of the bottom of the through hole 204 to expose the surface of the silicon substrate 201.

Subsequently, by CVD, silicon doped with impurities is deposited and buried inside the through hole 204. Next, CMP is performed to remove silicon from the surface of the multiple-stacked structure 210. Thus, a silicon pillar 209 shaped like a cylindrical column is formed inside the through hole 204. Thus, the vertical-type NAND memory 200 according to this example is manufactured.

In the NAND memory 200 according to this example, a plurality of memory cells are arranged along the silicon pillar 209. Furthermore, the silicon nitride layer 205 is selectively formed between the alumina layer 206 and the silicon film 203. Thus, by operation similar to that of the above third embodiment, the neighboring gate effect is reduced, and interference between memory cells is prevented.

In this example as illustrated, the silicon oxide film 202 serving as an intercellular dielectric film is formed by CVD, but it may be formed by other film formation methods, and any other dielectric materials primarily composed of silicon and oxygen may be used. Furthermore, the silicon film 203 serving as a control gate electrode is illustratively formed by CVD, but it may be formed by other film formation methods, and any other conductive materials primarily composed of silicon may be used.

In this example as illustrated, thermal nitridation is performed in an ammonia gas atmosphere or nitric monoxide gas atmosphere to nitridize the exposed surface of the silicon film 203, thereby forming the silicon nitride layer 205. However, the method for forming a silicon nitride layer is not limited thereto. For example, other nitridizing gas may be used, and radical nitridation may be used. Furthermore, instead of forming a silicon nitride layer 205, it is also possible to form a silicon oxide layer by thermal oxidation or radical oxidation. A silicon oxide layer formed by thermal oxidation or radical oxidation has a more dense structure and a higher dielectric constant than the silicon oxide film 202 formed by CVD.

Next, a fourth embodiment of the invention is described.

Figure 23:
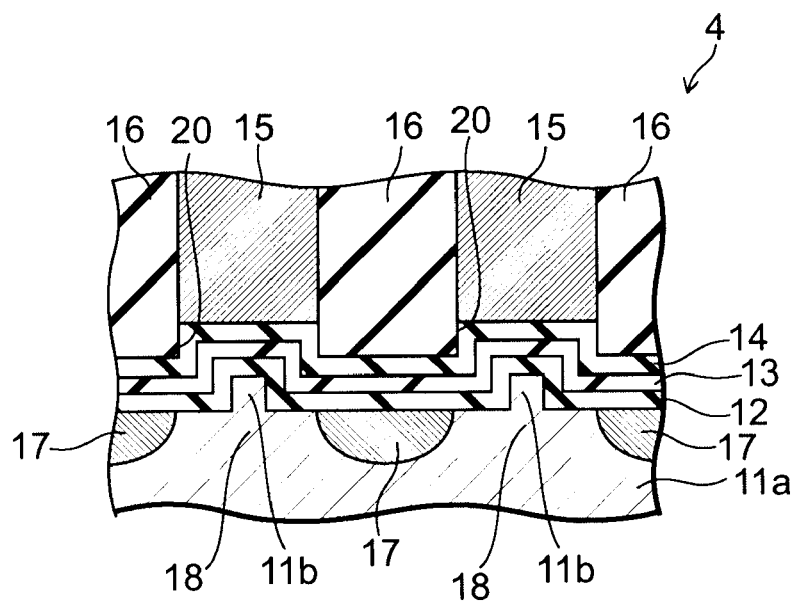
FIG. 23 is a cross-sectional view illustrating a NAND memory according to a fourth embodiment of the invention, showing a cross section parallel to the channel length direction.

FIG. 23 is a cross-sectional view illustrating a NAND memory according to this embodiment, showing a cross section parallel to the channel length direction.

As shown in FIG. 23, the NAND memory 4 according to this embodiment is a MONOS type memory. The NAND memory 4 includes, as a semiconductor member, a semiconductor layer 11a illustratively made of p-type silicon like the above first embodiment (see FIG. 1). On the semiconductor layer 11a, a tunnel dielectric layer 12 illustratively made of silicon oxide, a charge storage layer 13 illustratively made of silicon nitride, and a charge block layer 14 illustratively made of alumina are stacked in this order. On the charge block layer 14, control gate electrodes 15 made of conductor illustratively polycrystalline silicon doped with impurities and intercellular dielectric films 16 illustratively made of silicon oxide are alternately arranged along the channel length direction. The width of each of the control gate electrode 15 and the intercellular dielectric film 16 in the channel length direction is illustratively 50 nm. Furthermore, a diffusion region 17 is formed in the semiconductor layer 11a immediately below the intercellular dielectric film 16, and the region between the diffusion regions 17 serves a channel region 18.

In the NAND memory 4, the intercellular dielectric film 16 protrudes toward the semiconductor layer 11a relative to the control gate electrode 15. Thus, the lower surface of the structure composed of the plurality of control gate electrodes 15 and intercellular dielectric films 16 is not flat, but forms a corrugated surface with recesses 20 formed immediately below the control gate electrodes 15. The memory film composed of the tunnel dielectric layer 12, the charge storage layer 13, and the charge block layer 14 is curved along this corrugated surface. Thus, the tunnel dielectric layer 12, the charge storage layer 13, and the charge block layer 14 immediately below the control gate electrode 15 enter the recess 20.

Furthermore, the upper surface of the semiconductor layer 11a is also corrugated along this corrugated surface, and a projection 11b is formed in the semiconductor layer 11a immediately below the control gate electrode 15. Moreover, the dielectric constant of the intercellular dielectric film 16 in at least the protrusion thereof is lower than the average dielectric constant of the memory film composed of the tunnel dielectric layer 12, the charge storage layer 13, and the charge block layer 14, and illustratively lower than the dielectric constant of any of the tunnel dielectric layer 12, the charge storage layer 13, and the charge block layer 14.

Next, the operation and effect of this embodiment are described.

In the NAND memory 4 according to this embodiment, only the tunnel dielectric layer 12, the charge storage layer 13, and the charge block layer 14 are interposed between the control gate electrode 15 of the selected memory cell and the selected channel region 18. On the other hand, in addition to the tunnel dielectric layer 12, the charge storage layer 13, and the charge block layer 14, the intercellular dielectric film 16 is also interposed between the control gate electrode 15 of the selected memory cell and the adjacent channel region 18. Hence, as compared with the distance between the control gate electrode 15 of the selected memory cell and the selected channel region 18 (the distance between the selected gate and the selected channel), the distance between the selected gate and the adjacent channel is larger. Furthermore, the material interposed between the control gate electrode 15 of the selected memory cell and the adjacent channel region 18 has a lower average dielectric constant than the material interposed between the control gate electrode 15 of the selected memory cell and the selected channel region 18.

Consequently, while the control gate electrode 15 of a memory cell to be written (selected memory cell) is allowed to exert strong electrical control over the channel region 18 of this memory cell (selected channel), the electrical effect of the control gate electrode of the selected memory cell exerted on the channel region 18 of the adjacent memory cell (adjacent channel) can be reduced. This serves to reduce the neighboring gate effect, prevent interference between memory cells, and avoid memory malfunction due to threshold voltage variation of the cell transistor.

Furthermore, in this embodiment, the memory film composed of the tunnel dielectric layer 12, the charge storage layer 13, and the charge block layer 14 is curved along the corrugated lower surface of the control gate electrodes 15 and the intercellular dielectric films 16 and enter the recesses 20. Hence, the effective distance between adjacent memory cells is long in the charge storage layer 13. This can prevent the charge stored in a memory cell from migrating to the adjacent memory cell.

Furthermore, the charge stored in one memory cell is subjected to a force counteracting its migration to the adjacent memory cell. This also serves to restrict charge migration. More specifically, suppose that in a first memory cell, a positive write potential is applied to the control gate electrode 15 to inject electrons into the charge storage layer 13, and then a write potential is applied to the control gate electrode 15 of a second memory cell adjacent to the first memory cell. In this case, the electrons stored in the charge storage layer 13 of the first memory cell are subjected to an electrostatic force directed to the control gate electrode 15 of the second memory cell, that is, directed obliquely upward in FIG. 23. However, for this electron to migrate from the first memory cell to the second memory cell, it needs to go downward once to circumvent the intercellular dielectric film 16. Thus, the electrons stored in the charge storage layer 13 of the first memory cell are subjected to an electrostatic force counteracting its migration to the second memory cell, that is, a force directed back to the first memory cell. Hence, the electrons stored in the first memory cell and being about to diffuse by the self-field, for example, are returned to the first memory cell by applying a write potential to the second memory cell. Consequently, stable charge retention characteristics can be realized.

The NAND memory 4 according to this embodiment may be a horizontal-type nonvolatile memory or vertical-type nonvolatile memory. In the case where the NAND memory 4 is a horizontal-type memory, the semiconductor layer 11a is illustratively made of a semiconductor substrate formed by dicing a silicon wafer or the like. On the other hand, in the case where the NAND memory 4 is a vertical-type memory, the semiconductor layer 11a is illustratively the aforementioned silicon pillar. The same also applies to the variation of this embodiment, and the fifth embodiment and its variation described below.

Next, a variation of the fourth embodiment is described.

Figure 24:
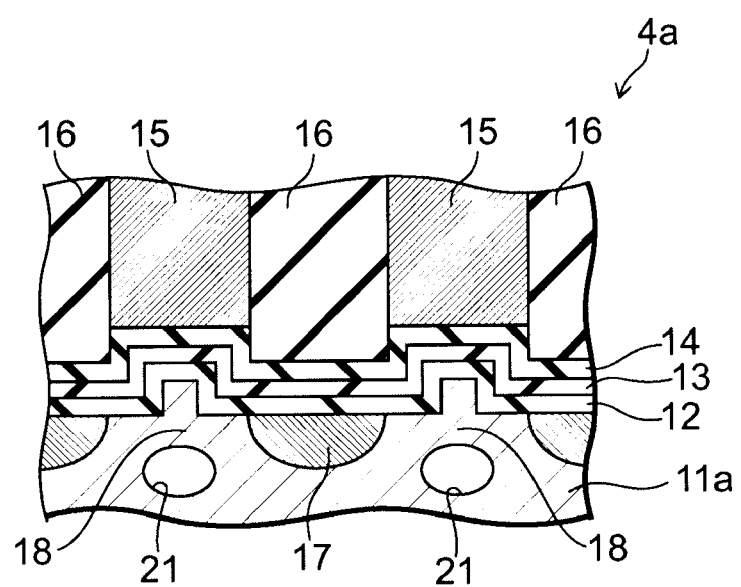
FIG. 24 is a cross-sectional view illustrating a NAND memory according to a variation of the fourth embodiment, showing a cross section parallel to the channel length direction.

FIG. 24 is a cross-sectional view illustrating a NAND memory according to this variation, showing a cross section parallel to the channel length direction.

As shown in FIG. 24, the NAND memory 4a according to this variation is different from the NAND memory 4 according to the above fourth embodiment in that a cavity 21 is formed below the channel region 18 in the semiconductor layer 11a. Here, the inside of the cavity 21 may be a vacuum or filled with gas.

In this variation, because the cavity 21 is formed, the current flowing through the channel region 18 concentrates on the upper portion of the semiconductor layer 11a, that is, the portion near the control gate electrode 15. Thus, by extending the depletion layer from the upper surface of the semiconductor layer 11a to the cavity 21, the channel region 18 can be entirely depleted to turn off the cell transistor, enhancing the electrical control of the control gate electrode of the selected memory cell over the selected channel. This relatively weakens the electrical effect of the control gate electrode of the selected memory cell exerted on the adjacent channel, and the neighboring gate effect can be further reduced. The configuration, operation, and effect of this variation other than the foregoing are the same as those of the above fourth embodiment.

The outer edge of the cavity 21 in the channel length direction does not necessarily need to be located immediately below the boundary between the control gate electrode 15 and the intercellular dielectric film 16, but the aforementioned effect is achieved even if it is displaced toward either the control gate electrode 15 or the intercellular dielectric film 16. Furthermore, the same effect is achieved also by burying a dielectric material instead of the cavity 21.

Next, an example of the fourth embodiment is described.

Figure 25:
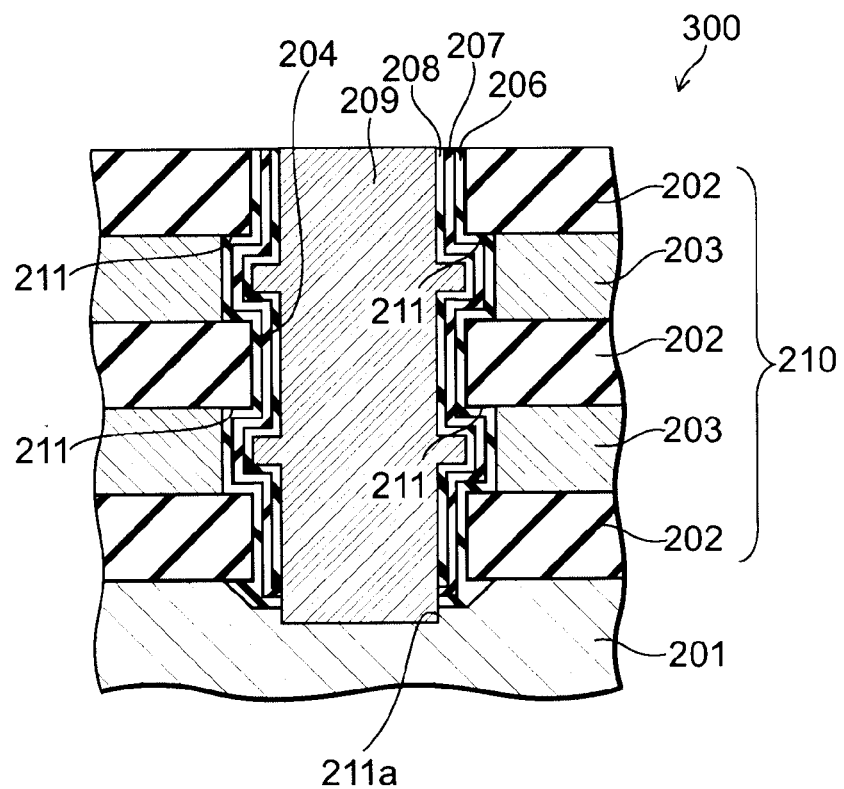
FIG. 25 is a cross-sectional view illustrating a NAND memory according to an example of the fourth embodiment, showing a cross section parallel to the vertical direction.

FIG. 25 is a cross-sectional view illustrating a NAND memory according to this example, showing a cross section parallel to the vertical direction.

Although the number of silicon films 203 is illustratively two in FIG. 25, the number of silicon films 203 is arbitrary. To increase the degree of integration of the memory, it is preferable to increase the number of stacked layers within the allowable range of processing constraints.

As shown in FIG. 25, the NAND memory 300 according to this example is a vertical-type flash memory. The NAND memory 300 is different from the NAND memory 200 according to the example of the above third embodiment (see FIGS. 18 and 19) in that, at the side surface of the through hole 204, the exposed surface of the silicon film 203 is recessed relative to the exposed surface of the silicon oxide film 202. Conversely, at the side surface of the through hole 204, the silicon oxide film 202 protrudes toward the inside of the through hole 204 relative to the silicon film 203. In the cross section along the central axis of the through hole 204, the protrusion of the silicon oxide film 202 illustratively has a rectangular shape. Thus, on the side surface of the through hole 204, recesses 211 are periodically formed along the vertical direction to form a corrugated surface. It is noted that the protrusion of the silicon oxide film 202 may be shaped like a curved surface. At the bottom of the through hole 204, a recess 211a is formed in the silicon substrate 201.

Furthermore, the memory film composed of the alumina layer 206, the silicon nitride layer 207, and the silicon oxide layer 208 is curved along the corrugated side surface of the through hole 204 and enters inside the recesses 211 and 211a. Moreover, in this example, the silicon nitride layer 205 is not provided. The configuration of this example other than the foregoing is the same as that of the NAND memory 200 according to the example of the above third embodiment (see FIGS. 18 and 19).

The dimensions of components in the NAND memory 300 are illustratively as follows. The silicon oxide film 202 and the silicon film 203 each have a thickness of e.g. approximately 50 nm. In the through hole 204, the portion made of the silicon oxide film 202 has a diameter of e.g. approximately 60 nm, and the portion made of the silicon film 203 has a diameter of e.g. approximately 100 nm. That is, at the side surface of the through hole 204, the silicon film 203 is set back by approximately 20 nm relative to the silicon oxide film 202, and the recess 211 has a depth of 20 nm. Furthermore, the alumina layer 206 serving as a charge block layer has a thickness of e.g. approximately 10 nm, the silicon nitride layer 207 serving as a charge storage layer has a thickness of e.g. approximately 5 nm, and the silicon oxide layer 208 serving as a tunnel dielectric layer has a thickness of e.g. approximately 3 nm. It is noted that a diffusion prevention layer (not shown) illustratively made of silicon nitride and having a thickness of e.g. approximately 2 nm may be formed outside the alumina layer 206, that is, between the silicon oxide film 202 and the silicon film 203.

Next, a method for manufacturing a NAND memory according to this example is described.

FIGS. 26 to 29 are process cross-sectional views illustrating the method for manufacturing a NAND memory according to this example, showing a cross section parallel to the vertical direction (channel length direction).

Figure 26:
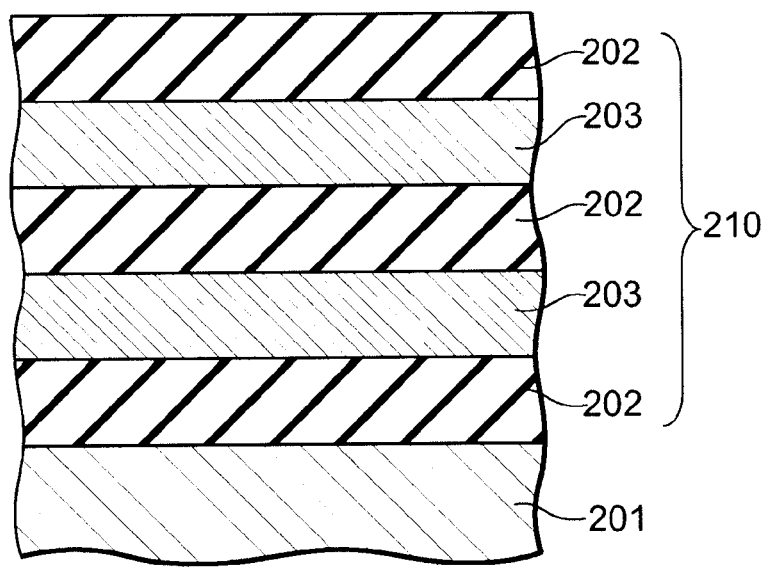
FIG. 26 is a process cross-sectional view illustrating a method for manufacturing a NAND memory according to the example of the fourth embodiment, showing a cross section parallel to the vertical direction.
Figure 27:
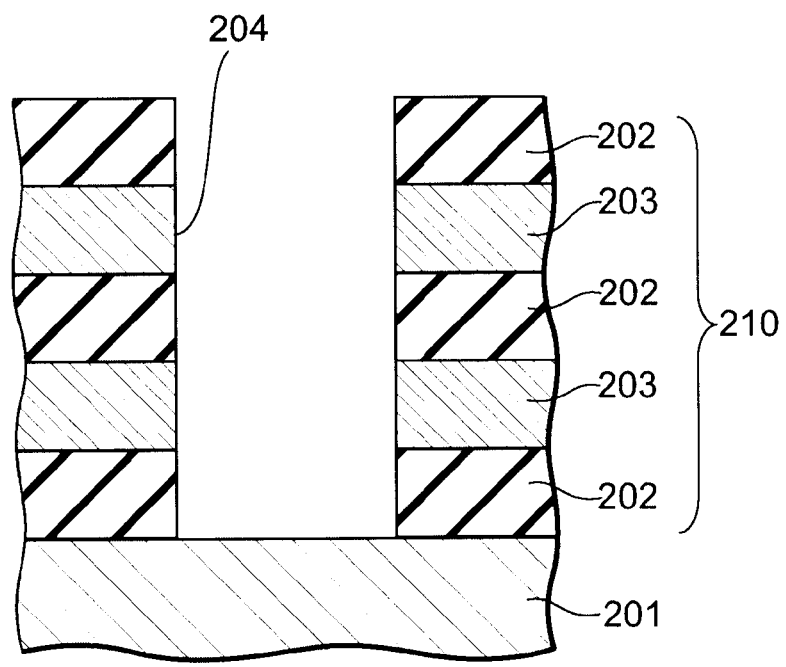
FIG. 27 is a process cross-sectional view illustrating a method for manufacturing a NAND memory according to the example of the fourth embodiment, showing a cross section parallel to the vertical direction.

First, as shown in FIG. 26, by a method similar to that of the example of the above third embodiment (see FIGS. 19 to 22), silicon oxide films 202 and silicon films 203 are alternately deposited on a silicon substrate 201 to form a multiple-stacked structure 210. The silicon film 203 is illustratively formed from polycrystalline silicon doped with an impurity element. Next, as shown in FIG. 27, a through hole 204 is formed in the multiple-stacked structure 210. In a later process, a silicon channel will be formed inside the through hole 204.

Figure 28:
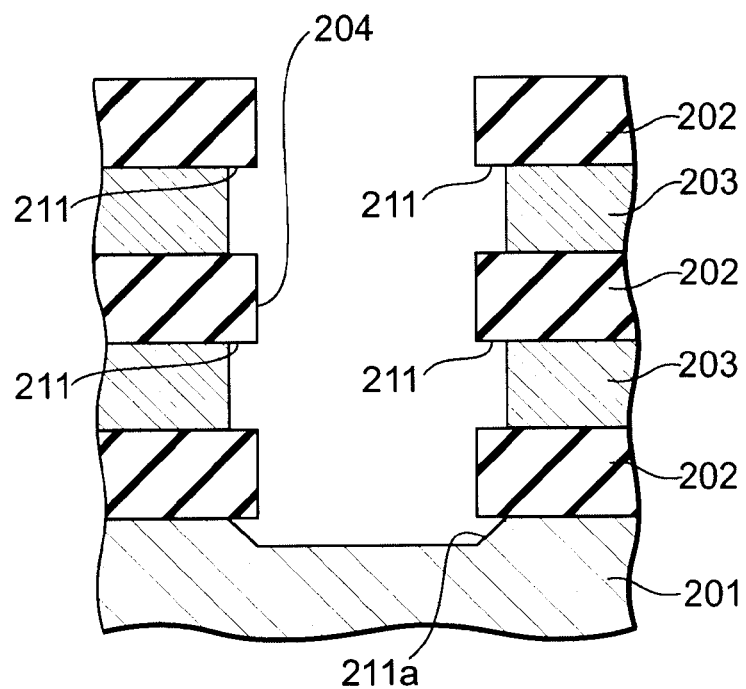
FIG. 28 is a process cross-sectional view illustrating a method for manufacturing a NAND memory according to the example of the fourth embodiment, showing a cross section parallel to the vertical direction.

Next, as shown in FIG. 28, selective etching is performed on the inner surface of the through hole 204. For example, wet etching is performed using an etching liquid such as potassium hydroxide solution or dilute aqueous ammonia. Thus, the portion of silicon exposed to the inner surface of the through hole 204 is selectively etched. Consequently, at the side surface of the through hole 204, the exposed portion of the silicon film 203 and the silicon substrate 201 is removed, and the exposed surface of the silicon film 203 is set back relative to the exposed surface of the silicon oxide film 202 to form a recess 211. Here, at the bottom of the through hole 204, the silicon substrate 201 is etched to form a recess 211a.

Figure 29:
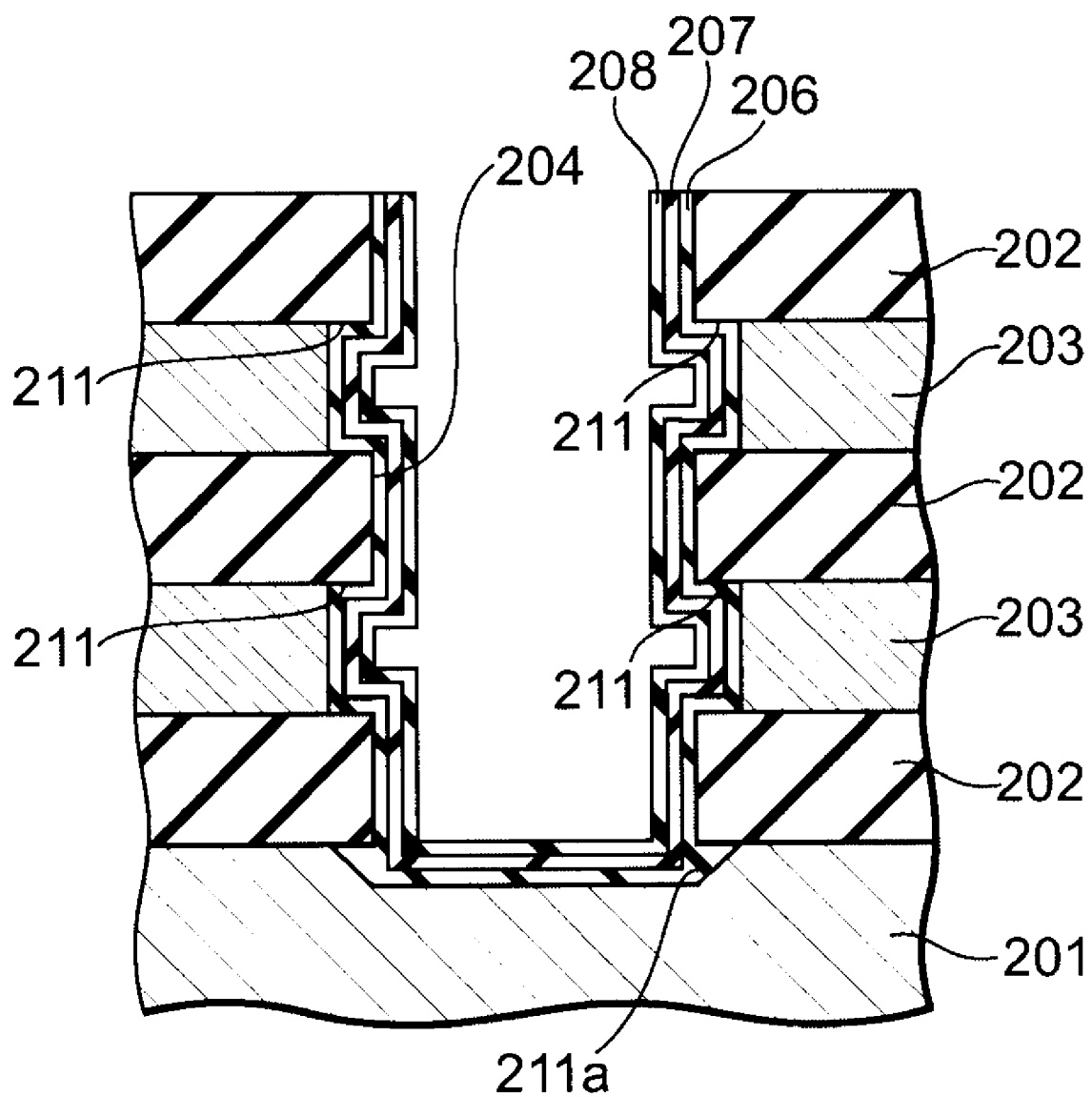
FIG. 29 is a process cross-sectional view illustrating a method for manufacturing a NAND memory according to the example of the fourth embodiment, showing a cross section parallel to the vertical direction.

Next, if necessary, a diffusion prevention layer (not shown) illustratively made of silicon nitride having a thickness of 2 nm is formed on the inner surface of the through hole 204. Next, as shown in FIG. 29, by ALD, an alumina layer 206 serving as a charge block layer and having a thickness of e.g. 10 nm, and a silicon nitride layer 207 serving as a charge storage layer and having a thickness of e.g. 5 nm are deposited in this order on the inner surface of the through hole 204. Next, a silicon oxide layer 208 serving as a tunnel dielectric layer and having a thickness of e.g. 3 to 5 nm is formed by, for example, ALD using trisdimethylaminosilane (SiH(N(CH$_3$)$_2$)$_3$, TDMAS) and ozone. Thus, a memory film is formed.

Next, as shown in FIG. 25, a resist mask (not shown) is formed on the multiple-stacked structure 210 and on the inner surface of the through hole 204, and used as a mask to perform RIE. Thus, the silicon oxide layer 208, the silicon nitride layer 207, and the alumina layer 206 are selectively removed from the center portion of the bottom of the through hole 204 to expose the surface of the silicon substrate 201.

Subsequently, by selective epitaxial silicon growth, for example, silicon having n-type conductivity is deposited and buried inside the through hole 204. Thus, while maintaining the crystallinity of the underlying silicon substrate 201, silicon can be grown to form a silicon layer with few crystal defects. Here, silicon is buried also in the recesses 211 and 211a. Next, CMP is performed to remove silicon from the surface of the multiple-stacked structure 210. Thus, a silicon pillar 209 shaped like a cylindrical column is formed inside the through hole 204. Consequently, the vertical-type NAND memory 300 according to this example is manufactured.

Next, the operation and effect of this example are described.

Figure 30A:
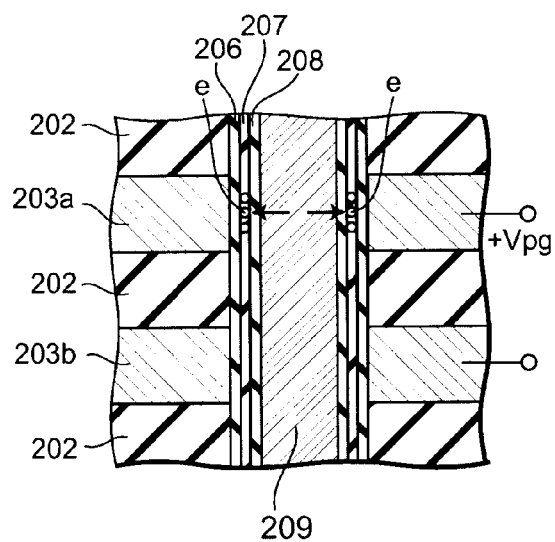
FIGS. 30A to 30D are schematic cross-sectional views showing the effect of the example of the fourth embodiment.
Figure 30B:
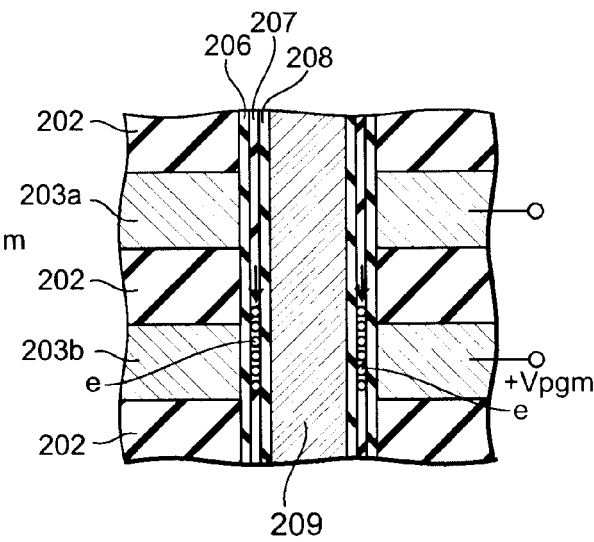
Figure 30C:
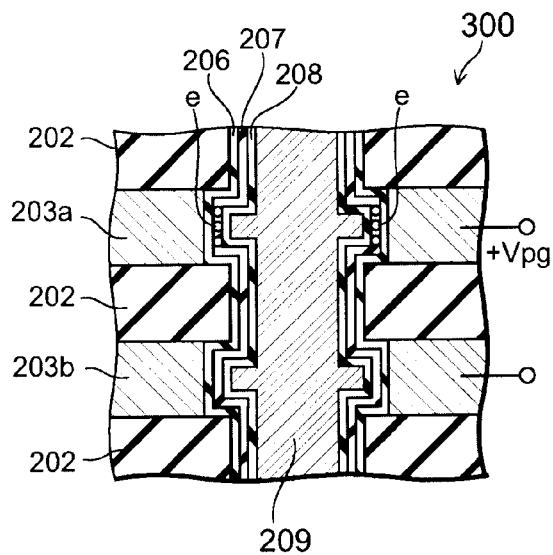
Figure 30D:
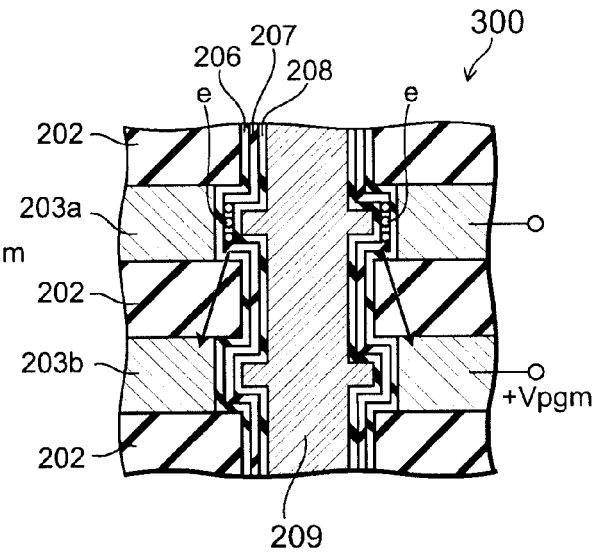

FIGS. 30A to 30D are schematic cross-sectional views showing the effect of this example, where FIGS. 30A and 30B show a comparative example in which no recesses are formed on the side surface of the through hole, and FIGS. 30C and 30D show this example in which recesses are formed on the side surface of the through hole.

In the NAND memory 300 according to this example, a plurality of memory cells are arranged along the silicon pillar 209. Furthermore, the recess 211 is formed in the portion of the silicon film 203 exposed to the inner surface of the through hole 204. Thus, by operation similar to that of the above fourth embodiment, the neighboring gate effect can be reduced, and interference between memory cells can be prevented.

More specifically, the silicon oxide film 202 serving as an intercellular dielectric film has a lower dielectric constant than the memory film composed of the alumina layer 206, the silicon nitride layer 207, and the silicon oxide layer 208. This serves to reduce the electrical effect of the potential of one silicon film 203 exerted on the portion of the silicon pillar 209 surrounded by the adjacent silicon film 203, and the neighboring gate effect can be prevented.

Furthermore, preventing charge migration between memory cells also serves to prevent interference between memory cells. As shown in FIG. 30A, in the NAND memory according to the comparative example in which no recesses are formed on the side surface of the through hole, upon application of a positive write potential +Vpgm to the silicon film 203a serving as the control gate electrode of one memory cell, electrons e are stored in the portion of the charge storage layer, that is, the silicon nitride layer 207, of this memory cell located near the silicon film 203a. However, as shown in FIG. 30B, upon application of the write potential +Vpgm to the silicon film 203b of the next memory cell, the electron e stored near the silicon film 203a is subjected to an electrostatic force directed to the silicon film 203b, and eventually migrates toward the silicon film 203b over time. Furthermore, even if the write potential is not applied to the silicon film 203b, electrons end up migrating by the self-field of the electrons stored. This may vary the threshold voltage of the cell transistor, and in extreme cases, erase data once written. Such interference between memory cells is more noticeable as the thickness of the silicon oxide film 202 and the silicon film 203 decreases, and hence causes a serious problem with the downscaling of the NAND memory.

In contrast, as shown in FIGS. 30C and 30D, in the NAND memory 300 according to this example, at the inner surface of the through hole 204, the silicon oxide film 202 protrudes toward the inside of the through hole 204. Hence, for the electron e stored in the silicon nitride layer 207 near the silicon film 203a to migrate toward the vicinity of the silicon film 203b, it needs to circumvent the protrusion of the silicon oxide film 202, and hence it needs to migrate once toward the inside of the through hole 204. However, upon application of the write potential +Vpgm to the silicon film 203b, an electrostatic force directed to the outside of the through hole 204 acts on the electrons. This makes it difficult for the electron e stored in the silicon nitride layer 207 near the silicon film 203a to migrate toward the vicinity of the silicon film 203b.

Thus, despite the downscaling of the memory, this example can reduce interference between memory cells due to migration of electrons. For example, this example can prevent data once written in a memory cell from being erased when data is written into the adjacent memory cell. In particular, in a vertical-type NAND memory like this example, this effect is particularly advantageous because in its manufacturing process, it is difficult to divide the silicon nitride layer 207 serving as a charge storage layer for each memory cell. The configuration, operation, and effect of this example other than the foregoing are the same as those of the above fourth embodiment.

In this example as illustrated, the recess 211 is formed by selective etching with liquid chemicals. However, other selective etching methods such as RIE may be used. Furthermore, in this example as illustrated, the control gate electrode is made of the silicon film 203, but may be made of a metal film or metal silicide film. In this case, the metal film or metal silicide film can be selectively etched by a liquid mixture of aqueous ammonia and hydrogen peroxide solution diluted with water to form a recess 211.

Next, an example of the variation of the above fourth embodiment is described.

Figure 31:
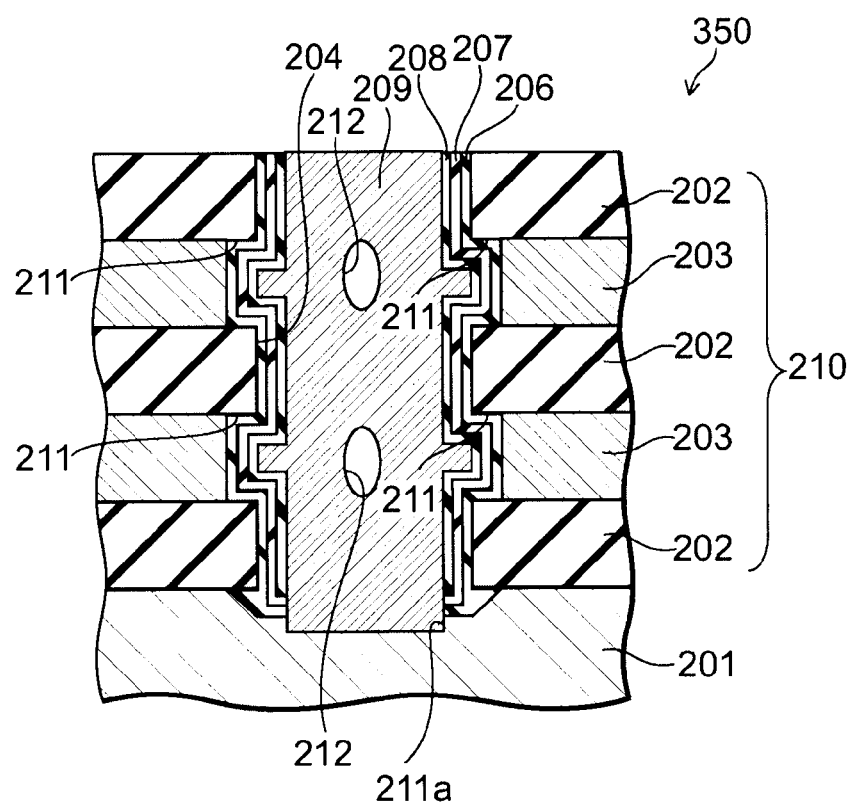
FIG. 31 is a cross-sectional view illustrating a NAND memory according to an example of the variation of the fourth embodiment, showing a cross section parallel to the channel length direction.

FIG. 31 is a cross-sectional view illustrating a NAND memory according to this example, showing a cross section parallel to the vertical direction (the channel length direction).

As shown in FIG. 31, in the NAND memory 350 according to this example, cavities 212 are formed in the region on the central axis of the silicon pillar 209 surrounded by the silicon film 203 serving as a control gate electrode. The configuration of the NAND memory 350 other than the foregoing is the same as that of the above NAND memory 300 (FIG. 25).

In this example, when the recess 211 is formed in the step shown in FIG. 28 during the process of manufacturing the above NAND memory 300, the width and depth of the recess 211 are set to approximately 1/5 or more of the diameter of the through hole 204. Furthermore, when the silicon pillar 209 is formed, silicon is deposited by a CVD method with poor step coverage. Thus, the cavities 212 can be formed in the silicon pillar 209, and the NAND memory 350 according to this example can be manufactured. The method for manufacturing the NAND memory 350 other than the foregoing is the same as the above method for manufacturing the NAND memory 300.

In the NAND memory 350 according to this example, cavities 212 are formed in the silicon pillar 209. Hence, to turn off the cell transistor, the depletion layer only needs to be extended from the outer peripheral surface of the silicon pillar 209 to the cavity 212, and does not need to be extended to the center of the silicon pillar 209. Thus, the off-current can be reduced. On the other hand, in the above NAND memory 300, no cavity is formed in the silicon pillar. Hence, the depletion layer needs to be extended to the vicinity of the center of the silicon pillar 209, which results in decreasing the threshold voltage of the cell transistor. However, absence of cavities contributes to increasing the effective cross-sectional area of the silicon pillar 209, allowing the on-current to be increased. Whether to form cavities in the silicon pillar may be selected in accordance with the required characteristics of the cell transistor. The operation and effect of this example other than the foregoing are the same as those of the above fourth embodiment and its variation and example.

Next, a fifth embodiment of the invention is described.

Figure 32:
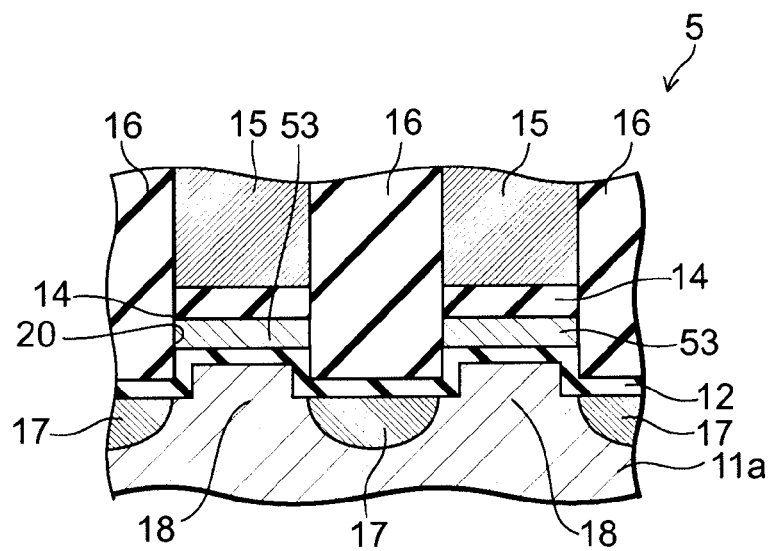
FIG. 32 is a cross-sectional view illustrating a NAND memory according to a fifth embodiment of the invention, showing a cross section parallel to the channel length direction.

FIG. 32 is a cross-sectional view illustrating a NAND memory according to this embodiment, showing a cross section parallel to the channel length direction.

As shown in FIG. 32, the NAND memory 5 according to this embodiment is a flash memory of the so-called floating-gate type in which the charge storage layer is made of a conductor. The NAND memory 5 is different from the NAND memory 4 according to the above fourth embodiment (see FIG. 23) in that the charge storage layer 53 and the charge block layer 14 are divided for each memory cell along the channel length direction, each divided portion of the charge storage layer 53 and the charge block layer 14 being housed in the recess 20. Furthermore, the tunnel dielectric layer 12 is formed as a continuous film and curved along the recess 20, and the portion of the tunnel dielectric layer 12 immediately below the control gate electrode 15 enters the recess 20. Moreover, the charge storage layer 53 is made of a conductor, such as a metal. Thus, the divided charge storage layer 53 serves as a floating-gate electrode of each memory cell, and the cell transistor constituting each memory cell serves as a floating-gate type transistor. The dielectric constant of the intercellular dielectric film 16 is lower than both the dielectric constant of the tunnel dielectric layer 12 and the dielectric constant of the charge block layer 14. The configuration of this embodiment other than the foregoing is the same as that of the above fourth embodiment.

In this embodiment, the tunnel dielectric layer 12, the charge storage layer 53, and the charge block layer 14 are interposed between the control gate electrode of the selected memory cell and the selected channel. On the other hand, the tunnel dielectric layer 12 and the intercellular dielectric film 16 are interposed between the control gate electrode of the selected memory cell and the adjacent channel. Thus, the average dielectric constant between the control gate electrode of the selected memory cell and the adjacent channel is decreased. This serves to reduce the neighboring gate effect, prevent interference between memory cells, and avoid memory malfunction due to threshold voltage variation of the cell transistor. The operation and effect of this embodiment other than the foregoing are the same as those of the above fourth embodiment.

Next, a variation of the fifth embodiment is described.

Figure 33:
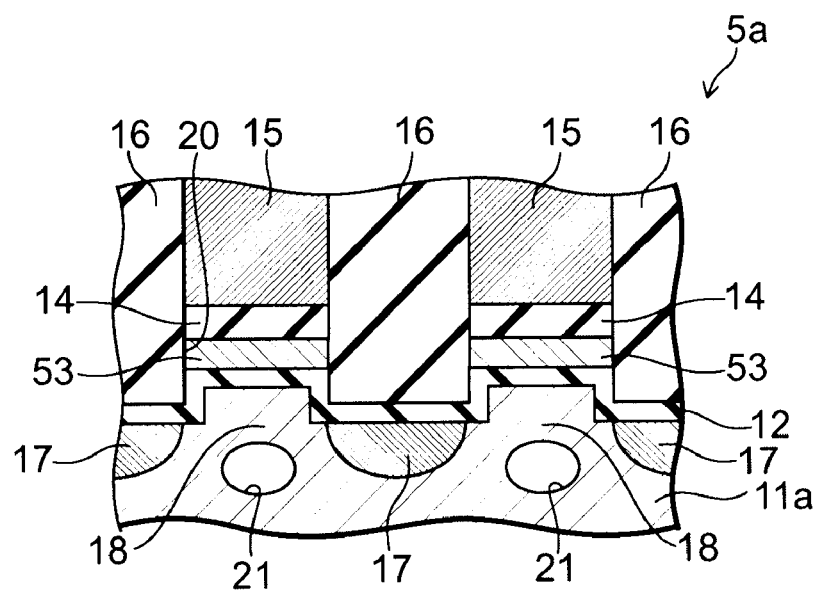
FIG. 33 is a cross-sectional view illustrating a NAND memory according to a variation of the fifth embodiment, showing a cross section parallel to the channel length direction.

FIG. 33 is a cross-sectional view illustrating a NAND memory according to this variation, showing a cross section parallel to the channel length direction.

As shown in FIG. 33, in this variation, the variation of the above fourth embodiment is combined with the fifth embodiment. More specifically, in the NAND memory 5a according to this variation, in addition to the configuration of the NAND memory 5 according to the above fifth embodiment (see FIG. 32), a cavity 21 is formed below the control gate electrode 15 in the semiconductor layer 11a. The configuration of this variation other than the foregoing is the same as that of the above fifth embodiment. Furthermore, the operation and effect of this variation other than the foregoing are the same as those described above in the variation of the fourth embodiment and in the fifth embodiment.

Next, a sixth embodiment of the invention is described.

Figure 34:
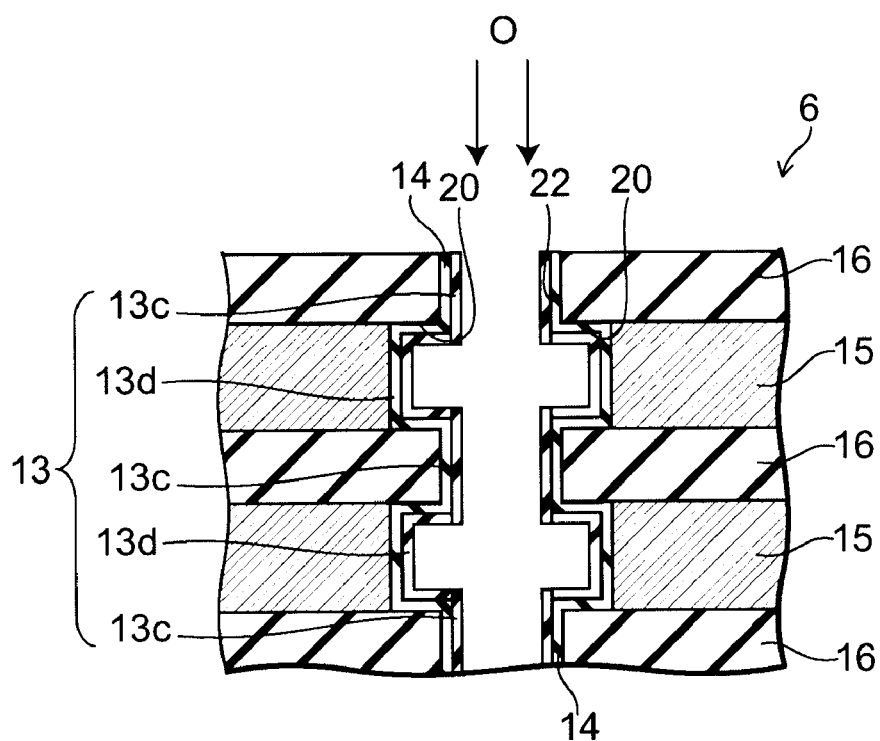
FIG. 34 is a process cross-sectional view illustrating a method for manufacturing a NAND memory according to a sixth embodiment of the invention.

FIG. 34 is a process cross-sectional view illustrating a method for manufacturing a NAND memory according to this embodiment.

As shown in FIG. 34, the NAND memory 6 according to this embodiment is a vertical-type memory. In the process for manufacturing the NAND memory 6, a through hole 22 is formed in the stacked body of control gate electrodes 15 and intercellular dielectric films 16, and the exposed portion of the control gate electrodes is selectively set back. Then, a charge block layer 14 made of alumina and a charge storage layer 13 made of silicon nitride are formed on the inner surface of the through hole 22, followed by anisotropic oxidation by such methods as thermal oxidation or radical oxidation using charged oxidizing species with a bias voltage applied to the stacked body (collectively referred to as "bias oxidation"), or oxygen ion implantation. Thus, oxygen is selectively introduced only into the portion 13c of the charge storage layer 13 located on the protrusion of the intercellular dielectric film 16, and the portion 13c is selectively oxidized. Consequently, the portion 13c has a higher oxygen concentration than the portion 13d formed on the control gate electrode 15.

Consequently, in the silicon nitride constituting the portion 13c of the charge storage layer 13, oxygen (O) is bonded to the dangling bond of silicon (Si) and decreases the density of charge trap states. Thus, in the portion 13c of the charge storage layer 13, the charge storage capacity decreases, and the hopping conduction of electrons is restricted. On the other hand, the portion 13d of the charge storage layer 13 formed on the control gate electrode 15 is located in the recess 20. Hence, the portion 13d is less oxidized, and its charge storage capacity does not substantially decrease. Consequently, the portion 13c of the charge storage layer 13 located on the protrusion has lower charge storage capacity than the portion 13d formed on the control gate electrode 15. Thus, the portion 13d having high charge storage capacity can be divided for each memory cell by the portion 13c having low charge storage capacity, and charge migration between memory cells can be prevented. Consequently, interference between memory cells can be prevented. The configuration, manufacturing method, operation, and effect of this embodiment other than the foregoing are the same as those of the above fourth embodiment and its example.

In this embodiment as illustrated, oxygen is selectively injected into the charge storage layer, but the invention is not limited thereto. Any substance decreasing the charge storage capacity of the charge storage layer 13 by addition to the charge storage layer 13 can be injected into the through hole. For example, it is possible to use any element that can be bonded to the dangling bond of the material constituting the charge storage layer 13 to decrease its density of charge trap states. For example, in the case where the charge storage layer 13 is made of silicon nitride, it is possible to inject boron (B), fluorine (F), or chlorine (Cl) besides oxygen. In such cases, the portion 13c has a higher concentration of boron, fluorine, or chlorine than the portion 13d.

Next, a seventh embodiment of the invention is described.

Figure 35:
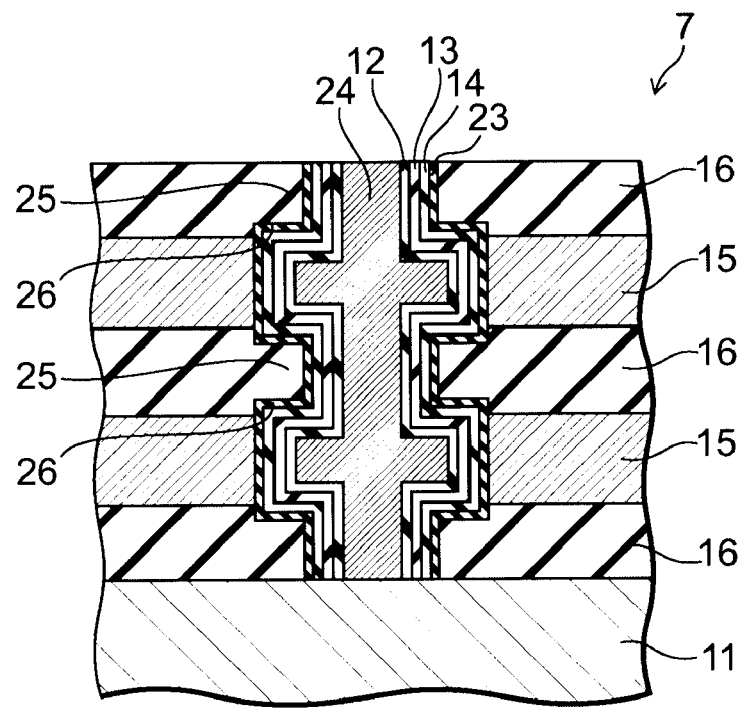
FIG. 35 is a cross-sectional view illustrating a NAND memory according to a seventh embodiment of the invention.

FIG. 35 is a cross-sectional view illustrating a NAND memory according to this embodiment.

As shown in FIG. 35, the NAND memory 7 according to this embodiment is a vertical-type memory. More specifically, the NAND memory 7 includes a semiconductor substrate 11, on which control gate electrodes 15 and intercellular dielectric films 16 are alternately stacked. Furthermore, a through hole 22 extending in the vertical direction, that is, the stacking direction, is formed in the stacked body of the control gate electrodes 15 and the intercellular dielectric films 16. On the side surface of the through hole 22, a diffusion prevention layer 23, a charge block layer 14, a charge storage layer 13, and a tunnel dielectric layer 12 are stacked in this order to form a memory film. Furthermore, in the through hole 22, a semiconductor pillar 24 extending in the vertical direction is provided as a semiconductor member in which a channel region is to be formed.

Furthermore, in the region of the side surface of the through hole 22 located on the intercellular dielectric film 16, a protrusion 25 is formed toward the inside of the through hole 22. The region of the side surface of the through hole 22 located between the protrusions 25 constitutes a recess 26. In the vertical direction, the protrusion 25 corresponds to the center portion of the intercellular dielectric film 16. Hence, the vertical width of the protrusion 25 is shorter than the width of the intercellular dielectric film 16. On the other hand, in the vertical direction, a control gate electrode 15 is located at the center portion of the bottom of each recess 26, and the upper and lower end of the recess 26 dig into the intercellular dielectric films 16. That is, each recess 26 extends over one control gate electrode 15 and the lower portion and the upper portion of the intercellular dielectric films located on both sides thereof. Thus, in the vertical direction, that is, the arranging direction of the control gate electrodes 15 and the intercellular dielectric films 16, the bottom of the recess 26 extends over a region including the control gate electrode 15 and being wider than the control gate electrode 15. Furthermore, the aforementioned memory film is corrugated along the corrugated surface formed by alternate arrangement of the protrusions 25 and the recesses 26. Thus, in the vertical direction, the flat region of the charge storage layer 13 formed on the recess 26 has a larger width than the control gate electrode 15.

The dimensions of components are illustratively as follows. The control gate electrode 15 and the intercellular dielectric film 16 each have a thickness of 50 nm. The vertical width of the protrusion 25 is 10 to 30 nm. Hence, the recess 26 has a width of 70 to 90 nm. Furthermore, the diffusion prevention layer 23 has a thickness of 2 nm, the charge block layer 14 has a thickness of 10 nm, the charge storage layer 13 has a thickness of 5 nm, and the tunnel dielectric layer 12 has a thickness of 3 nm.

Next, a method for manufacturing a NAND memory according to this embodiment is described.

Figure 36:
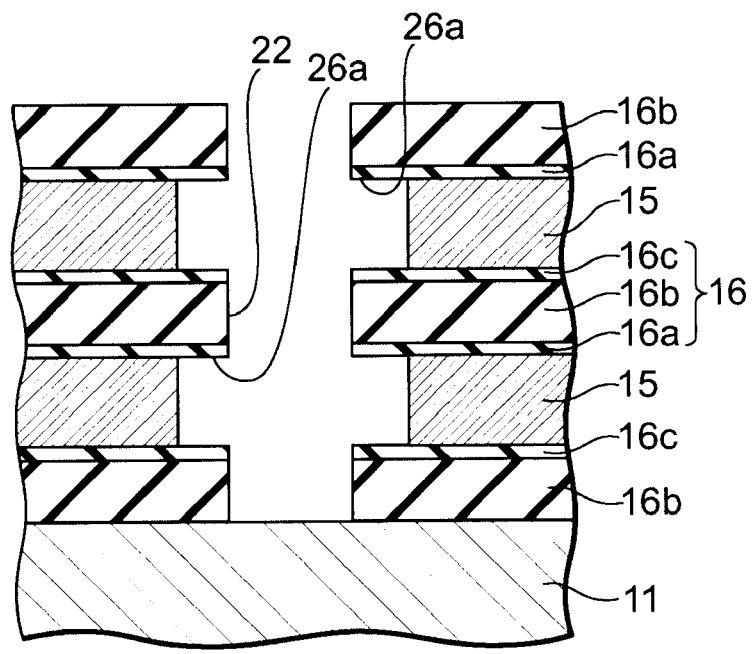
FIG. 36 is a process cross-sectional view illustrating a method for manufacturing a NAND memory according to the seventh embodiment.
Figure 37:
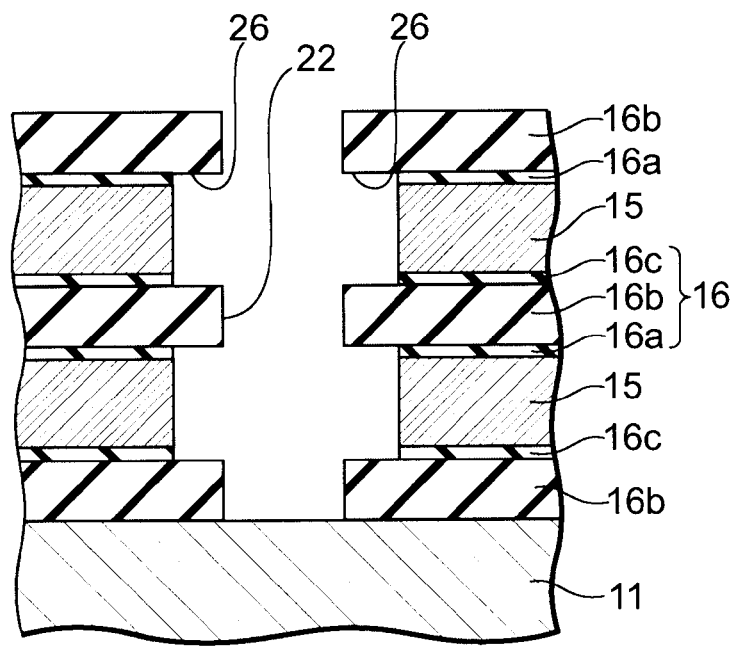
FIG. 37 is a process cross-sectional view illustrating a method for manufacturing a NAND memory according to the seventh embodiment.
Figure 38:
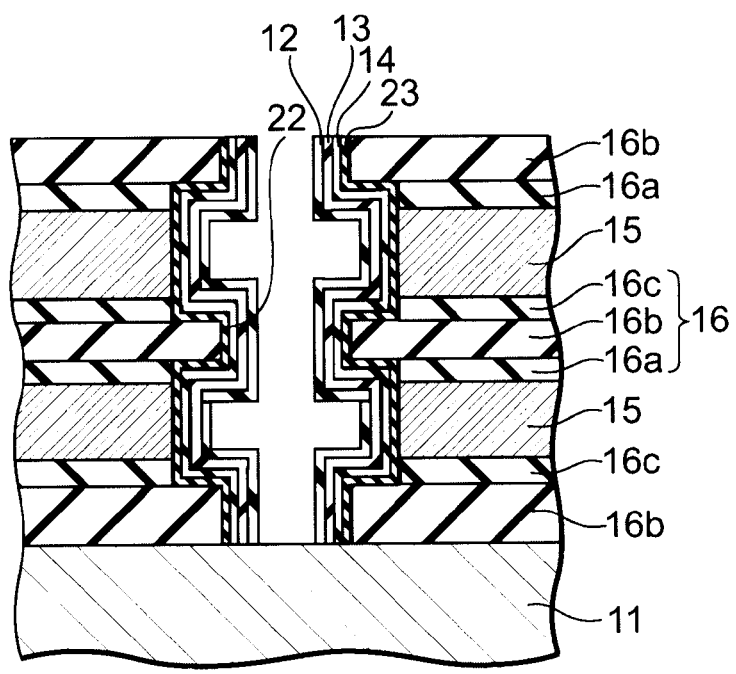
FIG. 38 is a process cross-sectional view illustrating a method for manufacturing a NAND memory according to the seventh embodiment.

FIGS. 36 to 38 are process cross-sectional views illustrating the method for manufacturing a NAND memory according to this embodiment.

First, as shown in FIG. 36, intercellular dielectric films 16 and control gate electrodes 15 are alternately formed on a semiconductor substrate 11 illustratively made of single crystal silicon. When the intercellular dielectric film 16 is formed, a gas of tetraethoxysilane (TEOS) mixed with trimethoxy borate (TMB) is used as a raw material gas to perform LPCVD (low pressure chemical vapor deposition) to form a lower portion 16a made of silicon oxide doped with impurities, such as boron-doped silicon oxide (BSG, borosilicate glass). Here, the boron concentration in BSG is illustratively 4 to 5 mass %. Next, a raw material gas containing only TEOS is used to perform LPCVD to form an intermediate portion 16b made of non-doped silicon oxide. Next, a method similar to that for forming the lower portion 16a is used to form an upper portion 16c made of BSG.

Next, a through hole 22 is formed in the stacked body of the control gate electrodes 15 and the intercellular dielectric films 16. Then, the control gate electrode 15 is selectively etched away to form a recess 26a in the portion of the control gate electrode 15 exposed to the side surface of the through hole 22.

Next, as shown in FIG. 37, the inner surface of the through hole 22 is exposed to a vapor of hydrofluoric acid to selectively etch the lower portion 16a and the upper portion 16c without substantially etching the intermediate portion 16b of the intercellular dielectric film 16. Thus, the portion of the lower portion 16a and the upper portion 16c exposed to the inner surface of the through hole 22 is removed, and the recess 26a (see FIG. 36) is vertically expanded to form a recess 26. Here, instead of dry etching using a vapor of hydrofluoric acid, wet etching using a liquid mixture of hydrofluoric acid and sulfuric acid may be used.

Next, as shown in FIG. 38, on the inner surface of the through hole 22, a diffusion prevention layer 23, a charge block layer 14, a charge storage layer 13, and a tunnel dielectric layer 12 are formed in this order. Then, these layers are removed from the surface at the bottom of the through hole 22. Next, as shown in FIG. 35, silicon is deposited in the through hole 22 to form a semiconductor pillar 24 extending in the vertical direction. Thus, the NAND memory 7 according to this embodiment is fabricated.

Next, the operation and effect of this embodiment are described.

According to this embodiment, like the above fourth embodiment, the intercellular dielectric film protrudes at the side surface of the through hole. Hence, the charge stored in the charge storage layer is difficult to migrate, achieving superior charge retention characteristics. Consequently, interference between memory cells can be prevented.

Furthermore, according to this embodiment, as compared with the above fourth embodiment, the recess 26 formed on the side surface of the through hole has a larger width. Hence, the portion of the charge storage layer 13 located near the control gate electrode 15, that is, the portion located at the bottom of the recess 26, has a larger area. Hence, a larger amount of charge is stored in each memory cell, and more favorable memory characteristics can be achieved.

Furthermore, this embodiment includes a diffusion prevention layer 23, which serves to prevent diffusion of elements between the charge block layer 14 and the control gate electrode 15, and between the charge block layer 14 and the intercellular dielectric film 16. Thus, it is possible to reliably avoid insulation degradation in the charge block layer 14, conduction degradation in the control gate electrode 15, and insulation degradation in the intercellular dielectric film 16.

In this embodiment as illustrated, the lower portion 16a and the upper portion 16c of the intercellular dielectric film 16 are formed from BSG, but this embodiment is not limited thereto. The lower portion 16a and the upper portion 16c can be formed from a dielectric material providing a sufficient etching selectivity with respect to the intermediate portion 16b made of non-doped silicon oxide, and can illustratively be formed from silicon oxide doped with impurities. Specifically, instead of BSG, a phosphorus-doped silicon oxide film (PSG, phosphosilicate glass) may be used. For example, in the case of using PSG containing phosphorus at 3 to 5 mass %, after the control gate electrode 15 is selectively etched to form a recess 26a, dilute hydrofluoric acid treatment can be performed to etch only the lower portion 16a and the upper portion 16c made of PSG without substantially etching the intermediate portion 16b.

Furthermore, in this embodiment as illustrated, the diffusion prevention layer 23 is provided. However, without the diffusion prevention layer 23, it is possible to achieve, as described above, the effect of restricting charge migration to prevent interference between memory cells and the effect of increasing the amount of charge stored in the memory cell to improve memory characteristics. Furthermore, insulation of the charge block layer 14, conductivity of the control gate electrode 15, and insulation of the intercellular dielectric film 16 can be maintained without problems in practical use. Moreover, also in this embodiment, like the above sixth embodiment, the charge storage capacity of the portion of the charge storage layer 13 formed on the protrusion 25 may be decreased by anisotropic oxidation or the like. This serves to more effectively restrict charge migration between memory cells and more reliably prevent interference between memory cells.

Next, a variation of the seventh embodiment is described.

Figure 39:
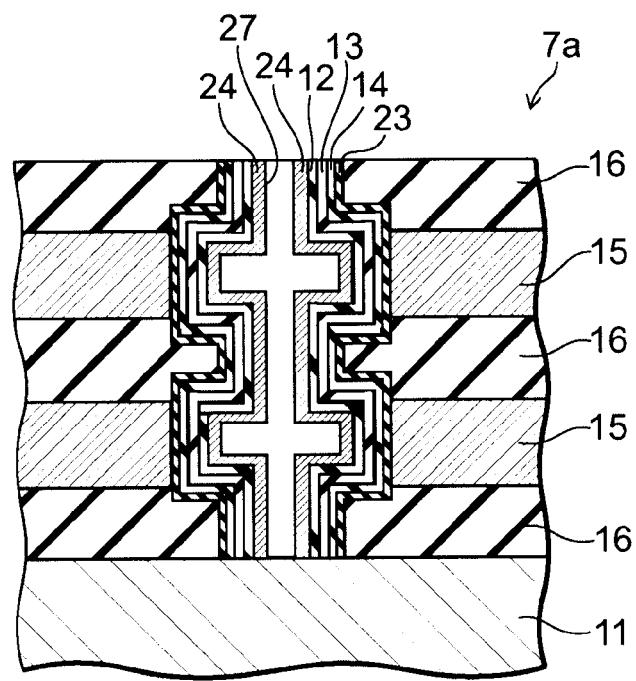
FIG. 39 is a cross-sectional view illustrating a NAND memory according to a variation of the seventh embodiment.

FIG. 39 is a cross-sectional view illustrating a NAND memory according to this variation.

As shown in FIG. 39, in the NAND memory 7a according to this variation, a cavity 27 is formed at the center of the semiconductor pillar 24. The cavity 27 may be filled with a dielectric material. In the above seventh embodiment, when the semiconductor pillar 24 is formed in the through hole 22, it can be formed by CVD as a thin film on the inner surface of the through hole 22. Thus, the space in the through hole 22 enclosed by the semiconductor pillar 24 constitutes a cavity 27.

According to this variation, when the cell transistor is turned off, the distance to extend the depletion layer in the semiconductor pillar 24 is decreased, and hence the cutoff characteristics can be improved. On the other hand, like the above seventh embodiment, if a semiconductor material is buried entirely in the through hole 22 to form a semiconductor pillar 24, the on-current can be increased. The configuration, manufacturing method, operation, and effect of this variation other than the foregoing are the same as those of the above seventh embodiment.

Next, an eighth embodiment of the invention is described.

Figure 40:
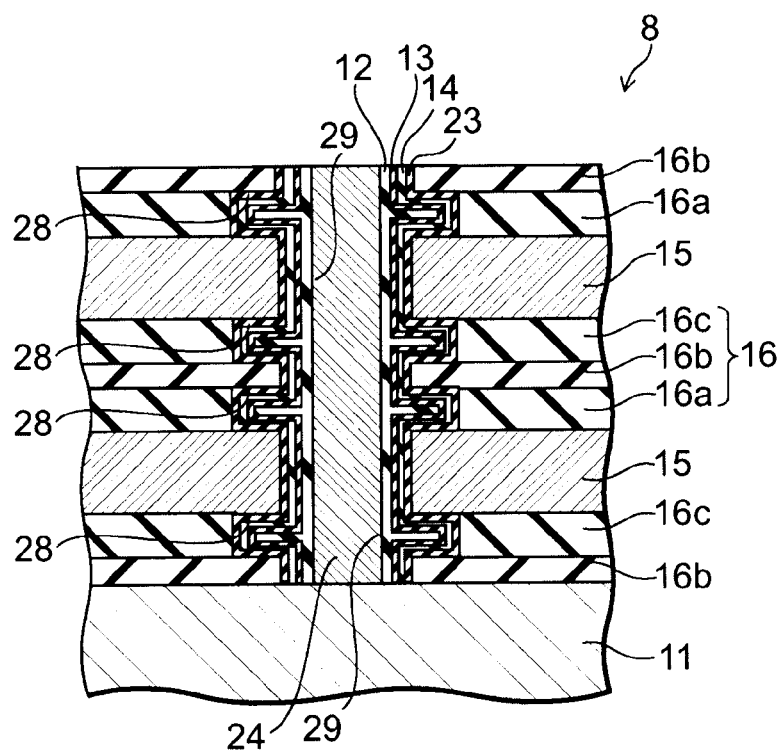
FIG. 40 is a cross-sectional view illustrating a NAND memory according to an eighth embodiment of the invention.

FIG. 40 is a cross-sectional view illustrating a NAND memory according to this embodiment.

As shown in FIG. 40, the NAND memory 8 according to this embodiment is a vertical-type memory. The NAND memory 8 is different from the NAND memory 7 according to the above seventh embodiment (see FIG. 35) in the layout of recesses formed on the side surface of the through hole 22.

More specifically, in this embodiment, on the side surface of the through hole 22, no recess is formed in the region located on the control gate electrode 15, but a recess 28 is formed in each of the vertical end portions of the intercellular dielectric film 16, that is, the lower portion 16a and the upper portion 16c. Hence, the recesses 28 are spaced from each other by the intermediate portion 16b of the intercellular dielectric film 16 or the control gate electrode 15. The recess 28 has a depth of e.g. 20 nm.

Furthermore, in the memory film, the diffusion prevention layer 23, the charge block layer 14, and the charge storage layer 13 are corrugated along the side surface of the through hole 22, whereas the tunnel dielectric layer 12 is formed so as to bury the recess 28. Thus, the interface 29 between the tunnel dielectric layer 12 and the semiconductor pillar 24 has little step difference, and is nearly flat in the cross section including the central axis of the through hole 22.

Next, a method for manufacturing a NAND memory according to this embodiment is described.

Figure 41:
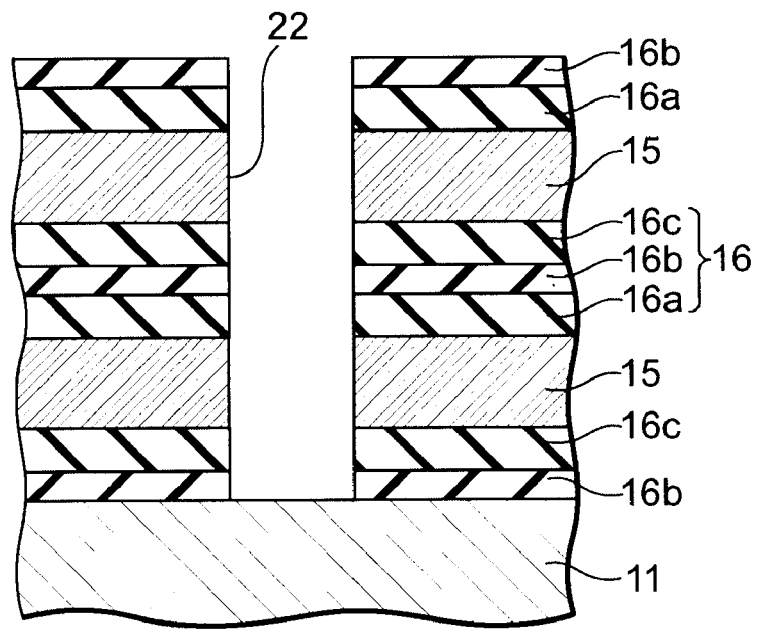
FIG. 41 is a process cross-sectional view illustrating a method for manufacturing a NAND memory according to the eighth embodiment.
Figure 42:
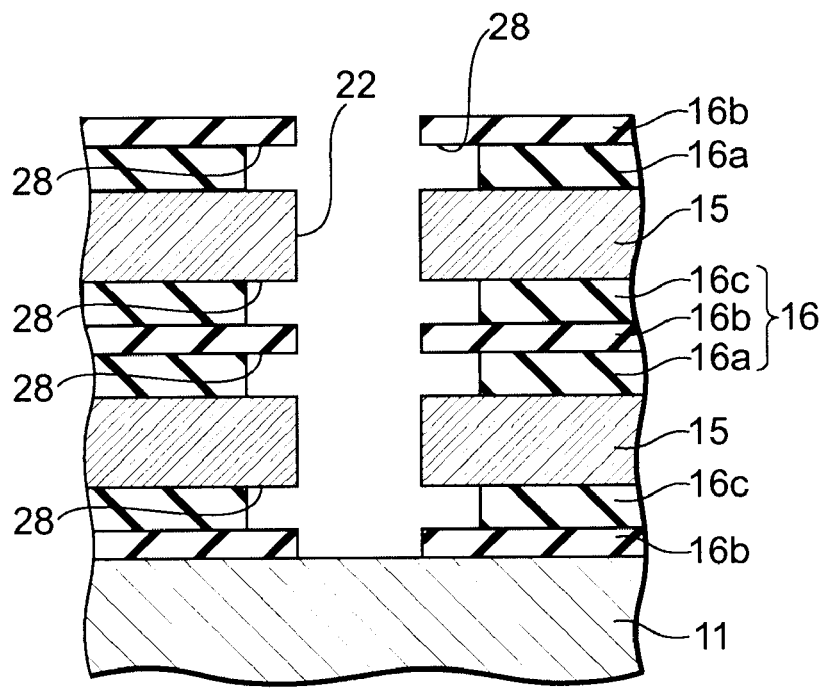
FIG. 42 is a process cross-sectional view illustrating a method for manufacturing a NAND memory according to the eighth embodiment.
Figure 43:
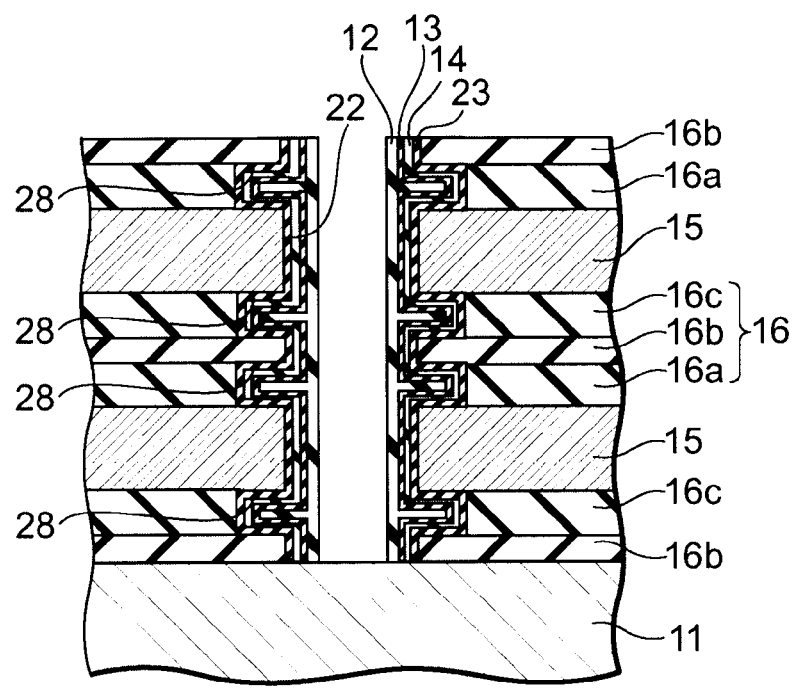
FIG. 43 is a process cross-sectional view illustrating a method for manufacturing a NAND memory according to the eighth embodiment.

FIGS. 41 to 43 are process cross-sectional views illustrating the method for manufacturing a NAND memory according to this embodiment.

First, as shown in FIG. 41, by a method similar to that of the above seventh embodiment, intercellular dielectric films 16 and control gate electrodes 15 are alternately stacked on a semiconductor substrate 11. Here, when the intercellular dielectric film 16 is formed, a lower portion 16a illustratively made of BSG is formed to a thickness of e.g. 20 nm, an intermediate portion illustratively made of non-doped silicon oxide is formed to a thickness of e.g. 10 nm, and an upper portion 16c illustratively made of BSG is formed to a thickness of e.g. 20 nm. The control gate electrode 15 is illustratively formed from silicon or silicide. Subsequently, a through hole 22 is formed in the stacked body of the intercellular dielectric films 16 and the control gate electrodes 15.

Next, as shown in FIG. 42, BSG is selectively etched in an atmosphere of vapor-phase hydrogen fluoride (HF) to form a recess 28 having a depth of e.g. approximately 20 nm in the portion of the lower portion 16a and the upper portion 16c exposed to the inner surface of the through hole 22.

Next, as shown in FIG. 43, on the inner surface of the through hole 22, a diffusion prevention layer 23, a charge block layer 14, a charge storage layer 13, and a tunnel dielectric layer 12 are deposited in this order to a thickness of e.g. 2 nm, 10 nm, 3 nm, and 5 nm, respectively. Here, the tunnel dielectric layer 12 is formed so that the recess 28 is buried. Next, as shown in FIG. 40, a semiconductor pillar 24 is buried in the through hole 22. Thus, the NAND memory 8 according to this embodiment is fabricated.

Next, the operation and effect of this embodiment are described.

Also in this embodiment, for the charge stored in each memory cell to migrate to the adjacent memory cell, it needs to circumvent the protrusion made of the intermediate portion 16b of the intercellular dielectric film 16. Hence, charge migration hardly occurs. Thus, interference between memory cells can be prevented.

Furthermore, no recess is formed in the region of the side surface of the through hole 22 located on the control gate electrode 15, but the charge storage layer 13 is located entirely in the vicinity of this region. Hence, a sufficient amount of charge can be stored. Furthermore, the tunnel dielectric layer 12 is buried in the recess 28, and the interface 29 between the tunnel dielectric layer 12 and the semiconductor pillar 24 is nearly flat in the cross section parallel to the vertical direction, that is, the channel length direction. Thus, the outer periphery of the semiconductor pillar 24 serving as a channel region is flat in the channel length direction along which the current flows. Hence, the cell transistor is superior in both on-characteristics and off-characteristics. The configuration, manufacturing method, operation, and effect of this embodiment other than the foregoing are the same as those of the above seventh embodiment. For example, the diffusion prevention layer 23 may be omitted.

Next, a variation of this embodiment is described.

Figure 44:
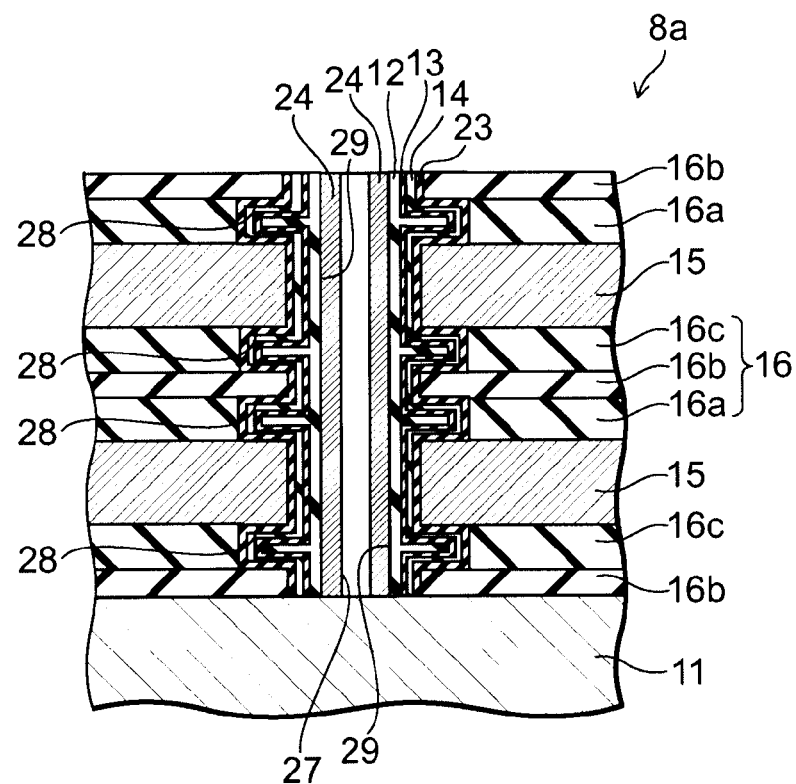
FIG. 44 is a cross-sectional view illustrating a NAND memory according to a variation of the eighth embodiment.

FIG. 44 is a cross-sectional view illustrating a NAND memory according to this variation.

As shown in FIG. 44, in the NAND memory 8a according to this variation, in addition to the configuration of the NAND memory 8 according to the above eighth embodiment (see FIG. 40), a cavity 27 is formed at the center of the semiconductor pillar 24. The cavity 27 may be filled with a dielectric material.

Like the variation of the above seventh embodiment, this variation can improve off-characteristics. In particular, in the case where the through hole 22 has a sufficiently large diameter, it is possible to achieve favorable off-characteristics while ensuring sufficient on-current. The configuration, manufacturing method, operation, and effect of this variation other than the foregoing are the same as those of the above eighth embodiment.

The above sixth to eighth embodiment and the variations thereof have been illustrated with reference to the NAND cell structures of the vertical MONOS type. In this type of vertical NAND memory, the aforementioned effect is particularly advantageous because it is difficult to separate the charge storage layer for each memory cell. However, applications of these embodiments are not limited to vertical-type NAND memories, but they are also applicable to NAND memories having the horizontal, that is, planar MONOS cell structure. Also in the horizontal-type NAND memory, charge migration in the charge storage layer can be prevented by providing a protrusion in the intercellular dielectric film.

The invention has been described with reference to the embodiments and the variations and examples thereof. However, the invention is not limited to these embodiments and the like. For example, the above embodiments and the variations and examples thereof can be practiced in combination with each other. Furthermore, the materials and dimensions of components are not limited to those in the above embodiments and the like. Moreover, those skilled in the art can suitably modify the above embodiments and the variations and examples thereof by addition, deletion, or design change of components, or by addition, omission, or condition change of processes, and such modifications are also encompassed within the scope of the invention as long as they fall within the spirit of the invention.

The invention claimed is:

1. A nonvolatile semiconductor memory device comprising:
    a semiconductor member;
    a memory film provided on a surface of the semiconductor member;
    first and second control gate electrodes provided on the memory film, spaced from each other, and arranged along a direction parallel to the surface; and
    a single-layered intercellular dielectric film provided between the first and the second control gate electrodes and spacing the first and second control gate electrodes, wherein the single-layered intercellular dielectric film in physical contact with the memory film;
    a first portion of the memory film located immediately below the single-layered intercellular dielectric film having a dielectric constant lower than a dielectric constant of another portions of the memory film located immediately below the first and second control gate electrodes, and
    a concentration of hydrogen or a halogen element in the first portion of the memory film located immediately below the single-layered intercellular dielectric film being higher than the concentration of hydrogen or the halogen element in the another portions of the memory film located immediately below the first and second control gate electrode electrodes.

2. The memory device according to claim 1, further comprising:
    a dielectric layer provided between the memory film and the first and second control gate electrodes and having a higher dielectric constant than that of the single-layered intercellular dielectric film.

3. The memory device according to claim 1, wherein the semiconductor member is a substrate supporting the memory film and the first and second control gate electrodes, or an upper portion of the substrate.

4. A nonvolatile semiconductor memory device comprising:
    a semiconductor member; a memory film provided on a surface of the semiconductor member;
    first and second control gate electrodes provided on the memory film, spaced from each other, and arranged along a direction parallel to the surface; and
    a single-layered intercellular dielectric film provided between the first and the second control gate electrodes and spacing the first and second control gate electrodes, wherein the single-layered intercellular dielectric film in physical contact with the memory film;
    a first portion of the memory film located immediately below the single-layered intercellular dielectric film having a dielectric constant lower than a dielectric constant of another portions of the memory film located immediately below the first and second control gate electrodes, and
    a concentration of a metallic element which makes the dielectric constant of a compound forming the memory film lower being higher in the first portion of the memory film located immediately below the single-layered intercellular dielectric film than that in the another portions of the memory film located immediately below the first and second control gate electrode electrodes.

5. The memory device according to claim 4, wherein the semiconductor member is a substrate supporting the memory film and first and second control gate electrodes, or an upper portion of the substrate.

* * * * *